United States Patent
Sano et al.

(10) Patent No.: US 7,552,414 B2
(45) Date of Patent: Jun. 23, 2009

(54) LAYOUT DESIGN APPARATUS, LAYOUT DESIGN METHOD, AND COMPUTER PRODUCT

(75) Inventors: Masahiro Sano, Kawasaki (JP); Koji Abe, Kawasaki (JP); Hitoshi Watanabe, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 156 days.

(21) Appl. No.: 11/704,274

(22) Filed: Feb. 9, 2007

(65) Prior Publication Data

US 2007/0136711 A1    Jun. 14, 2007

Related U.S. Application Data

(62) Division of application No. 10/924,768, filed on Aug. 25, 2004, now Pat. No. 7,194,718.

(30) Foreign Application Priority Data

Apr. 19, 2004    (JP)    ............... 2004-123549

(51) Int. Cl.
*G06F 17/50* (2006.01)
(52) U.S. Cl. ...................................... 716/10
(58) Field of Classification Search ...... 716/2, 716/4, 6, 8–10
See application file for complete search history.

(56) References Cited

U.S. PATENT DOCUMENTS

| | | | |
|---|---|---|---|
| 6,442,743 B1 | 8/2002 | Sarrafzadeh et al. | |
| 6,493,658 B1 | 12/2002 | Koford et al. | |
| 6,539,536 B1 | 3/2003 | Singh et al. | |
| 6,701,505 B1 | 3/2004 | Srinivasan | |
| 6,889,370 B1 | 5/2005 | Kerzman et al. | |
| 6,961,916 B2 | 11/2005 | Sarrafzadeh et al. | |
| 7,197,725 B2 * | 3/2007 | Takeoka et al. ............. | 716/4 |
| 2002/0138816 A1 | 9/2002 | Sarrafzadeh et al. | |
| 2003/0182649 A1 | 9/2003 | Harn | |
| 2005/0198605 A1 | 9/2005 | Knol et al. | |
| 2006/0031699 A1 | 2/2006 | Arthanari et al. | |

OTHER PUBLICATIONS

"Fujitsu Release AccelArray™ Structured ASIC Devices", http://pr.fujitsu.com/jp/news/2003/06/26.html,Apr. 17, 2004 (Search).

* cited by examiner

*Primary Examiner*—Stacy A Whitmore
(74) *Attorney, Agent, or Firm*—Staas & Halsey LLP

(57) ABSTRACT

A frame input unit receives an input of a frame having a placement area for an element to which a predetermined signal is supplied. A netlist input unit receives an input of a netlist concerning the element. A placing unit places the element in the placement area of the frame input by the frame input unit based on the netlist input by the netlist input unit. A detecting unit detects whether there is a vacant position in the placement area in which the element is placed by the placing unit, and a bypass-element placing unit places a bypass element at the vacant position detected by the detecting unit, the bypass element propagating the predetermined signal by bypassing the element located adjacent to the vacant position.

4 Claims, 22 Drawing Sheets

LAYOUT DESIGN APPARATUS, LAYOUT DESIGN METHOD, AND COMPUTER PRODUCT

CROSS-REFERENCE TO RELATED APPLICATIONS

This application is a divisional of U.S. patent application Ser. No. 10/924,768, filed Aug. 25, 2004 now U.S. Pat. No. 7,194,718. This application is based upon and claims the benefit of priority from the prior Japanese Patent Application No. 2004-123549, filed on Apr. 19, 2004, the entire contents of which are incorporated herein by reference.

BACKGROUND OF THE INVENTION

1. Field of the Invention

The present invention relates to a layout design apparatus for designing a large scale integrated (LSI) chip layout, a layout design method, and a computer product.

2. Description of the Related Art

A conventional LSI chip layout begins with making a clock tree, followed by a wiring of a scan chain and then a timing convergence. This configuration increases working time for the timing convergence and hence it inevitably takes a long time to make the design. To cope with the problem, a structured application specific integrated circuit (ASIC) has recently been developed therein a pre-designed SCAN circuit and a built-in self test (BIST) circuit (see, for example, web site of Fujitsu, searched on Apr. 17th, 2004, http://pr.fujitsu.com/jp/news/2003/06/26.html).

However, If any one of such pre-designed circuits is not necessary to a user, and it is still left, unnecessary power is supplied to the circuit as well, resulting in a problem of extra power consumption. Furthermore, with increasingly complex and speedy circuits, it is difficult to lay out a clock tree with a small clock skew, and this also prolongs the design time.

SUMMARY OF THE INVENTION

It is an object of the present invention to solve at least the above problems in the conventional technology.

The layout design apparatus according to one aspect of the present invention includes a frame input unit that receives an input of a frame having a placement area for an element to which a predetermined signal is supplied; a netlist input unit that receives an input of a netlist concerning the element; a placing unit that places the element in the placement area of the frame input by the frame input unit based on the netlist input by the netlist input unit; a detecting unit that detects whether there is a vacant position in the placement area in which the element is placed by the placing unit; and a bypass-element placing unit that places a bypass element at the vacant position detected by the detecting unit, the bypass element propagating the predetermined signal by bypassing the element located adjacent to the vacant position.

The layout design apparatus according to another aspect of the present invention includes a frame input unit that receives an input of a frame having a pre-placed element to which a predetermined signal is supplied; a netlist input unit that receives an input of a netlist concerning the pre-placed element; an assigning unit that assigns an element to which the predetermined signal is supplied in the netlist input by the netlist input unit to the pre-placed element in the frame input by the frame input unit; and an eliminating unit that eliminates the pre-placed element that is not assigned by the assigning unit.

The layout design apparatus according to still another aspect of the present invention includes a frame input unit that receives an input of a frame having a buffer tree that is clock-skew-adjusted embedded, the buffer tree including a root buffer serving as a start point and a plurality of branching buffers; a netlist input unit that receives an input of a netlist concerning an input element for inputting a clock signal and an element to which the clock signal is supplied; a placing unit that places the element and the input element in a placement area at an extremity of a buffer tree of the frame input by the frame input unit and on the frame, respectively, based on the netlist input by the netlist input unit; a determining unit that determines a wiring route from the root buffer to the element in the buffer tree where the element is placed by the placing unit; and a generating unit that generates a clock tree that starts at the input element and terminates at the elements placed in the placement area at the extremity of the buffer tree, based on the input element placed by the placing unit and the buffer tree having the wiring route determined by the determining unit.

The layout design method according to still another aspect of the present invention includes receiving an input of a frame having a placement area for an element to which a predetermined signal is supplied; receiving an input of a netlist concerning the element; placing the element in the placement area of the frame input by the frame input unit based on the netlist input by the netlist input unit; detecting unit whether there is a vacant position in the placement area in which the element is placed by the placing unit; and placing a bypass element at the vacant position detected by the detecting unit, the bypass element propagating the predetermined signal by bypassing the element located adjacent to the vacant position.

The layout design method according to still another aspect of the present invention includes receiving an input of a frame having a pre-placed element to which a predetermined signal is supplied; receiving an input of a netlist concerning the pre-placed element; assigning an element to which the predetermined signal is supplied in the netlist input by the netlist input unit to the pre-placed element in the frame input by the frame input unit; and eliminating the pre-placed element that is not assigned by the assigning unit.

The layout design method according to still another aspect of the present invention includes receiving an input of a frame having a buffer tree that is clock-skew-adjusted embedded, the buffer tree including a root buffer serving as a start point and a plurality of branching buffers; receiving an input of a netlist concerning an input element for inputting a clock signal and an element to which the clock signal is supplied; placing the element and the input element in a placement area at an extremity of a buffer tree of the frame input by the frame input unit and on the frame, respectively, based on the netlist input by the netlist input unit; determining a wiring route from the root buffer to the element in the buffer tree where the element is placed by the placing unit; and generating a clock tree that starts at the input element and terminates at the elements placed in the placement area at the extremity of the buffer tree, based on the input element placed by the placing unit and the buffer tree having the wiring route determined by the determining unit.

The computer readable recording medium according to still another aspect of the present invention stores a computer program that realizes the layout design methods according to the above aspects on a computer.

The other objects, features, and advantages of the present invention are specifically set forth in or will become apparent from the following detailed description of the invention when read in conjunction with the accompanying drawings.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Exemplary embodiments of a layout design apparatus, a layout design method, and a computer product according to the present invention will be explained below in detail with reference to the accompanying drawings.

Figure 1:
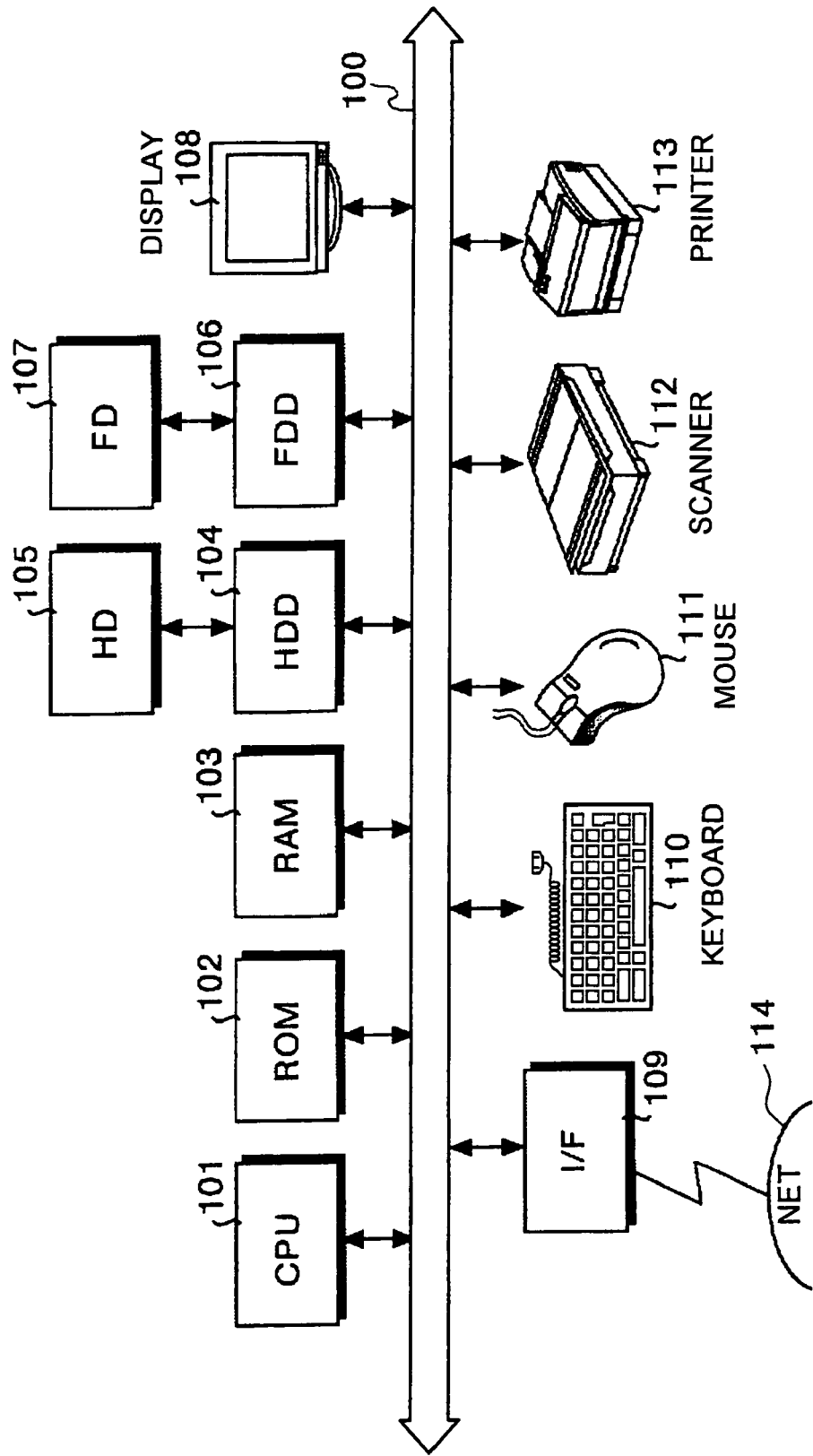
FIG. 1 is a schematic for illustrating a hardware configuration of a layout design apparatus according to a first embodiment of the present invention.

FIG. 1 is a schematic for illustrating a hardware configuration of a layout design apparatus according to a first embodiment of the present invention. A layout design apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible drive (FD) 107, an example of a removable recording medium, a display 108, an interface (I/F) 109, a keyboard 110, a mouse 111, a scanner 112, and a printer 113. These respective components are interconnected via a bus 100.

The CPU 101 controls the entire operation of the layout design apparatus. The ROM 102 stores therein programs such as a boot program. The RAM 103 is used as a work area of the CPU 101. The HDD 104 controls the data read/write operation of the HD 105, under the control of the CPU 101. The HD 105 stores the written data under the control of the HDD 104.

The FFD 106 controls the data read/write operation of the FD 107 under the control of the CPU 101. The FD 107 stores the data written under the control of the FDD 106, and allows the layout design apparatus to read the data stored in the FD 107.

The removable recording medium is not limited specifically to the FD 107, but may also be a CD-ROM (CD-R, CD-RW), a magneto optical (MO), a digital versatile disk (DVD), or a memory card. The display 108 displays data such as a document, an image, and functional information, including a cursor, icons, or a toolbox. The display 108 may be, for example, a cathode ray tube (CRT), a thin film transistor (TFT) liquid crystal display, or plasma display.

The I/F 109 is connected via a communication line to a network 114 such as the Internet, through which it is connected to other devices. The I/F 109 provides the interface between the network 114 and the layout design apparatus, and controls the input and output of data of an external device. For example, a modem or a LAN adapter may be employed as the I/F 109.

The keyboard 110 is provided with keys for inputting characters, numerals, and various instructions or commands. The keyboard 110 may be replaced with a touch panel type input pad or a numeric keypad. The mouse 111 is to move the cursor or specify the range of its movement, or scroll the window or change the window size. In this case, a track ball or a joystick may be used as long as it has the same functions as a pointing device.

The scanner 112 reads an image optically, and captures image data into the layout design apparatus. The scanner 112 may also have an optical character reader (OCR) function. The printer 113 prints image data and document data. The printer 113 may be a laser printer or an ink jet printer, for instance.

Figure 2:
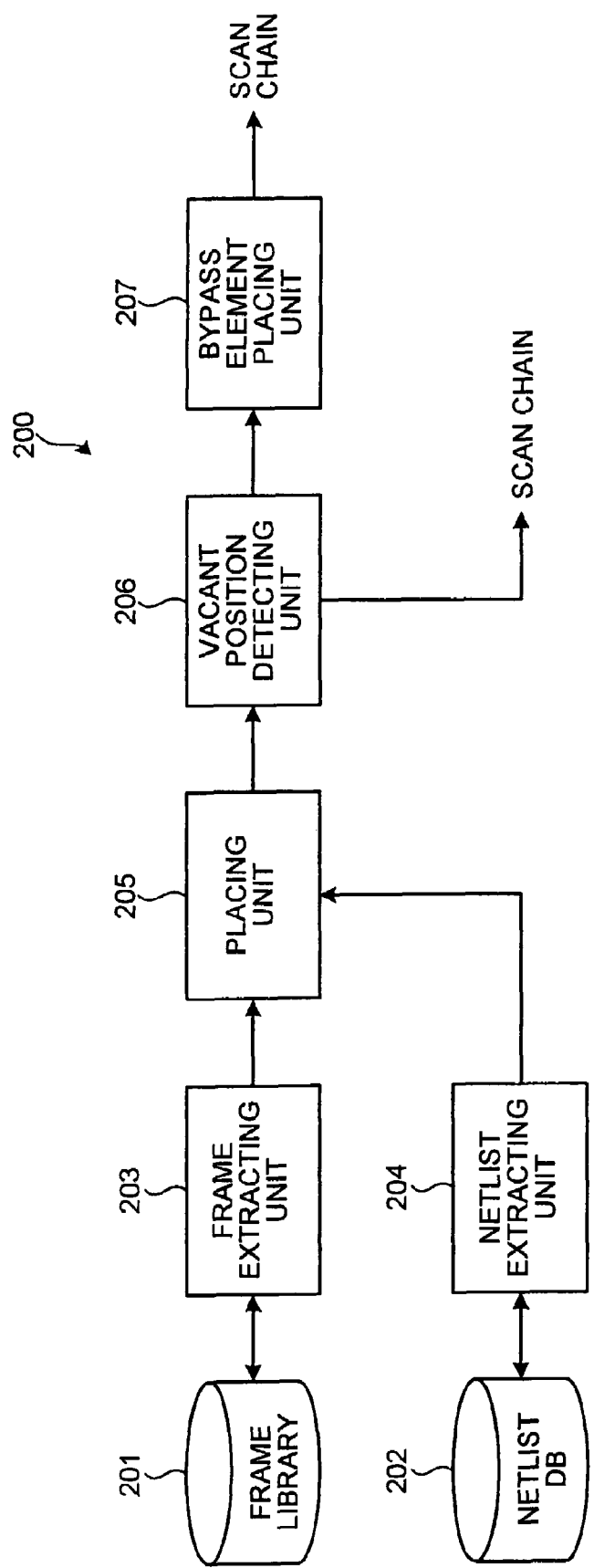
FIG. 2 is a schematic for illustrating a functional configuration of the layout design apparatus according to the first embodiment.

FIG. 2 is a schematic for illustrating a functional configuration of the layout design apparatus according to the first embodiment. The layout design apparatus 200 includes a frame library 201, a netlist data database 202, a frame extracting unit 203, a netlist extracting unit 204, a placing unit 205, a vacant position detecting unit 206, and a bypass-element placing unit 207.

Figure 3:
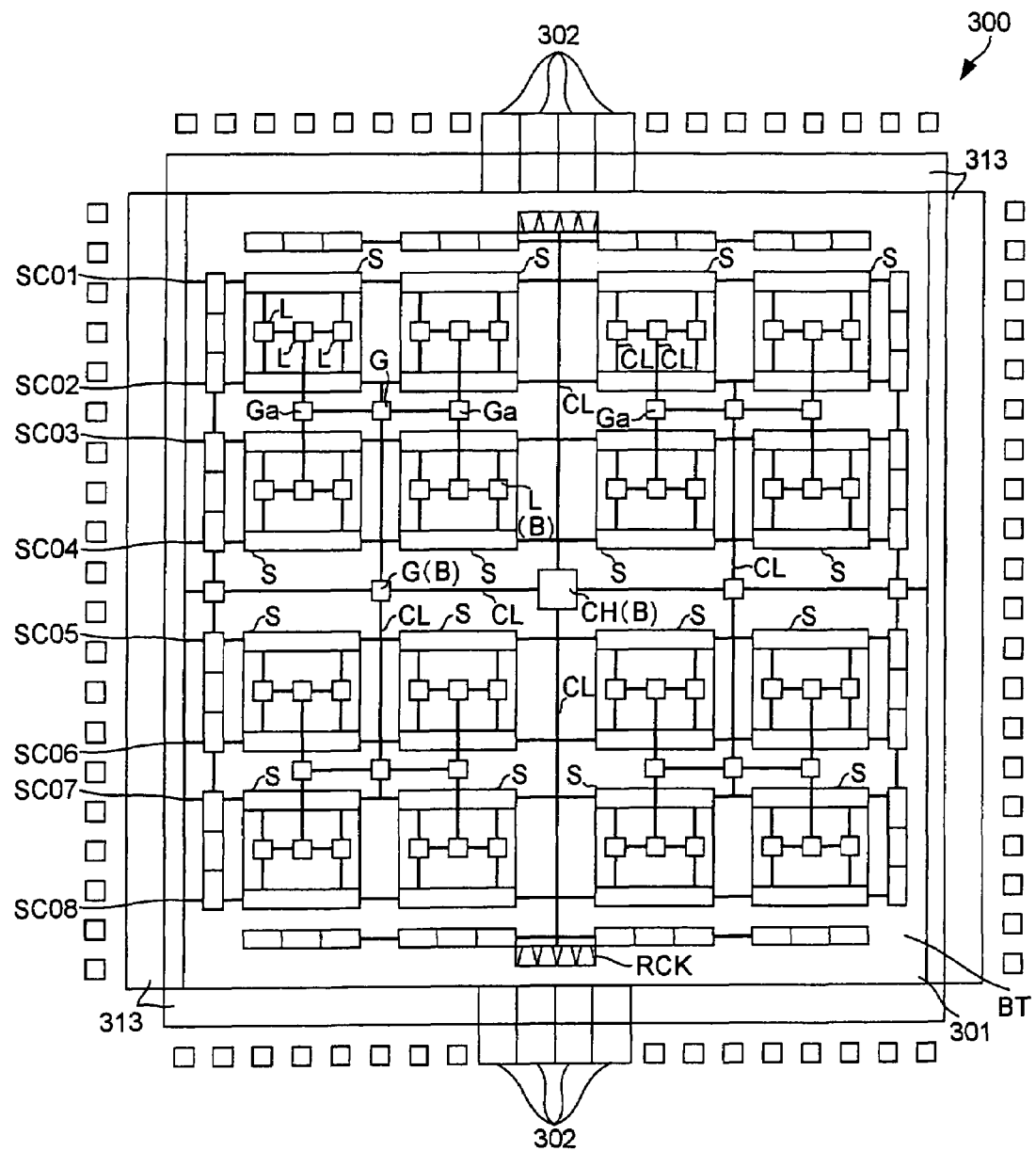
FIG. 3 is a schematic for illustrating an example of a frame stored in a frame library.

The frame library 201 stores a frame having a placement area in which to place an element to be supplied with a predetermined signal. A specific example of the frame will be explained below. FIG. 3 is a schematic for illustrating an example of a frame stored in a frame library 201. A frame 300 is data on a structured ASIC in which there are embedded pre-designed SCAN circuit and BIST circuit, the data containing scan chain wiring information.

The frame 300 has a substrate circuit unit 301 that is referred to as a master. The substrate circuit unit 301 has embedded therein a butter tree BT composed of a root clock buffer RCK serving as the starting point, a plurality of branching buffers B and clock lines CL (indicated by thick lines) that interconnect the branching buffers B. The centrally disposed one of the branching buffers B is a clock hub CH. The other branching buffers B are selectors called GBM, which distribute clock signals propagated thereto. The thick lines indicate clock lines forming the buffer tree BT.

At extremities of the buffer tree BT there are formed 16 basic blocks S. The basic blocks S are each connected to the nearest one of branching buffers Ga, through which a clock signal is propagated. Each basic block S includes: branching buffers L called LBM; an FF placement area 311 in which sequential circuit elements (hereinafter, "FFs") to be supplied with a scan signal and a clock signal are placed; a RAM placement area 312 in which to place memory elements (for, example, RAMs, not shown in FIG. 3) to be supplied with signals.

The branching buffers L are located in the FF placement area 311. The nearest branching buffer Ga and one of the branching buffers L is connected to the branching buffers L and the RAM placement area 312 by the clock lines CL. To the clock line CL on the FF placement area 311 is connected to FFs. In the RAM placement area 312 are placed RAMs. Reference signs SC01 to SC08 shown in FIG. 3 denote scan signal line (scan chains) that interconnect FFs.

On four sides of the substrate circuit unit 301, there are formed I/O areas 313. In the I/O areas 313 there are disposed clock terminals to which external clock signals are input. On the opposite marginal portions of the substrate circuit unit 301 there are provided PLLs 302.

Figure 4:
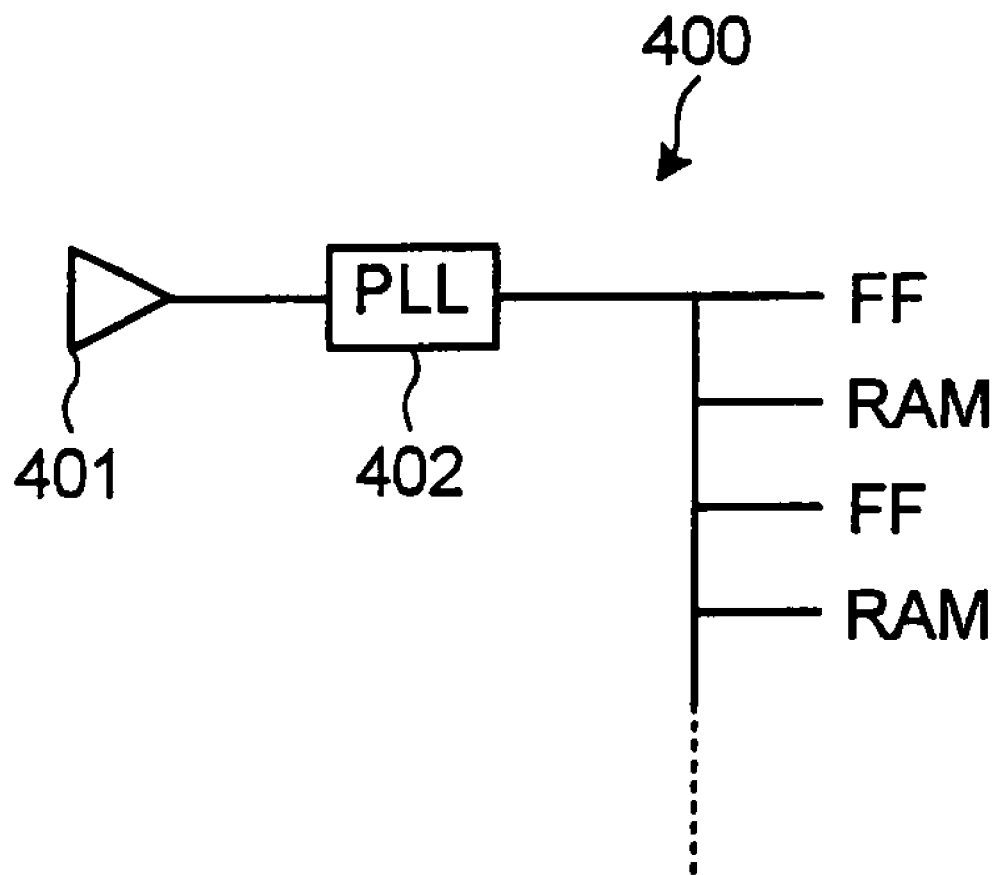
FIG. 4 is a schematic for illustrating an example of a netlist stored in a netlist database.

The netlist database has stored therein a netlist prepared by a user. FIG. 4 is a schematic for illustrating an example of a netlist stored in a netlist database 202. The netlist, denoted by 400, is made up of a clock terminal 401 to which a clock signal is input, a PLL 402, and FFs and RAMs that are elements to be supplied with signals.

The functions of the frame library 201 and the netlist database 202 in FIG. 2 are implemented by the ROM 102, the RAM 103, and such a recording medium as the HD 105 or FD 107 shown in FIG. 1. The frame library 201 and the netlist database 202 may also be provided in an external server accessible via the network 114.

The frame extracting unit 203 extracts the frame 300 from the frame library 201. Specifically, the frame 300, which fits the netlist requested by the user to design, is extracted by manipulating the keyboard 110 or mouse 111 shown in FIG. 1. The netlist extracting unit 204 extracts a netlist from the netlist database 202. Specifically, the user's requested netlist is extracted by manipulating the keyboard 110 or mouse 111 shown in FIG. 1.

Based on the netlist extracted by the netlist extracting unit 204, the placing unit 205 places elements, such as FFs and RAMs, in the placement areas of the frame 300 extracted by the frame extracting unit 203. In specific terms, the placing unit 205 automatically places the FFs in the FF placement area 311 and the RAMs in the RAM placement area 312 based on the connection relationships of the FFs and RAMs described in the extracted netlist.

Figure 5:
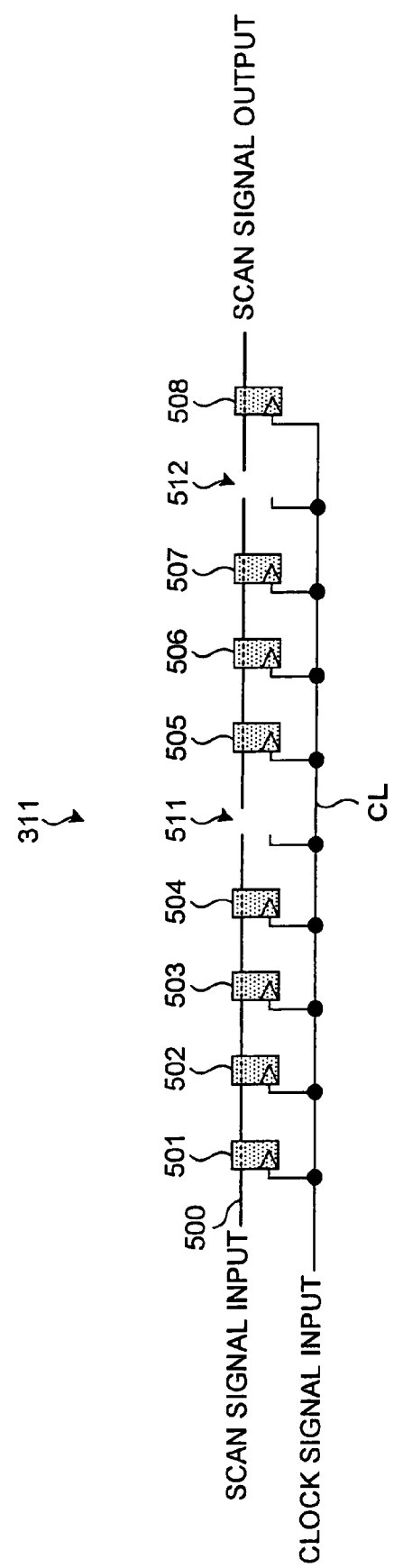
FIG. 5 is a schematic for illustrating an FF placement area where FFs are placed by a placing unit.

The vacant position detecting unit 206 detects whether there are vacant positions in the placement areas where the elements have been placed by the placing unit 205. This will be explained more specifically with reference to the case that the elements to be placed are FFs. FIG. 5 is a schematic for illustrating an FF placement area 311 where FFs are placed by a placing unit 205.

A plurality of FFs 501 to 508 is placed so that they are connected to a clock line CL and a scan signal line 500 wired in the FF placement area 311. In this instance, since no FFs are placed at the position 511 between the FFs 504 and 505, and at the position 512 between the FFs 507 and 508, the vacant position detecting unit 206 detects these positions 511 and 512 as vacant positions. With this configuration, it is possible to detect whether the scan signal line 500 is broken.

Figure 6:
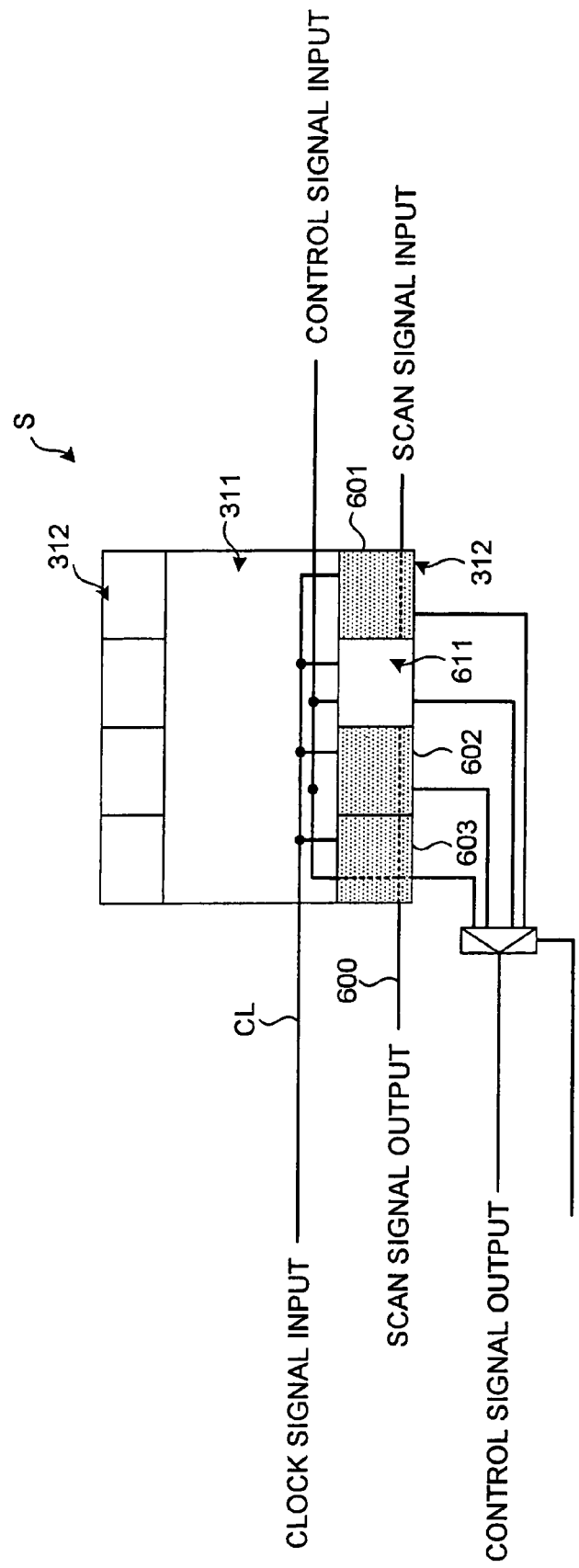
FIG. 6 is a schematic of a basic block S where RAMs are placed by the placing unit in an RAM placement area.

The operation of the vacant position detecting unit 206 will be explained in connection with the case that the elements to be placed are RAMs. FIG. 6 is a schematic of a basic block S where RAMs are placed by the placing unit 205 in an RAM placement area 312. A plurality of RAMs 601 to 603 is placed so that they are connected to a clock line CL and a scan signal line 600 wired in the RAM placement area 312. Since no RAM is placed at the position 611 between the RAMs 601 and 602, the vacant position detecting unit 206 detects the position 611 as a vacant position. This makes it possible to detect whether the scan signal line 600 is broken.

Figure 7:
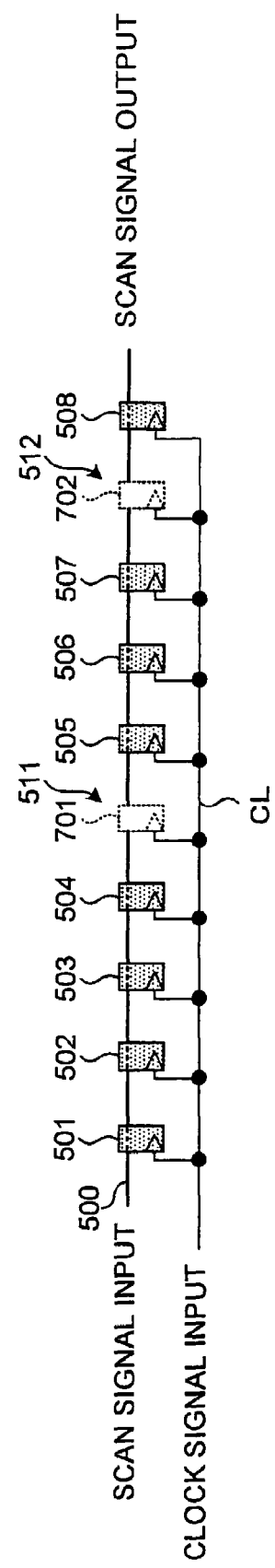
FIG. 7 is a schematic for illustrating bypass elements placed at vacant positions in the FF placement area shown in FIG. 5.

The bypass-element placing unit 207 places a bypass element at the vacant position detected by the vacant position detecting unit 206 to bypass the vacant position to propagate a predetermined signal from the one of the elements placed adjacent the vacant position to the other. This will be explained below in detail in connection with the case FFs are placed. FIG. 7 is a schematic for illustrating bypass elements placed at vacant positions in the FF placement area shown in FIG. 5.

A dummy FF 701 is placed at the vacant position 511 as a bypass element. The dummy FF 701 is a bypass element that bypasses the vacant position 511 and propagates therethrough a scan signal from FF 504 to FF 506 placed adjacent the vacant position 511. The dummy FF 701 does not perform such signal processing as is done by other FFs 501 to 508.

Similarly, there is placed at the vacant position 512 a dummy FF 702 as a bypass element. The dummy FF 702 is a bypass element that bypasses the vacant position 512 and propagates therethrough a scan signal from FF 507 to FF 508 placed adjacent the vacant position 512. The dummy FF 702 does not perform such signal processing as is done by other FFs 501 to 508. With this processing, the scan signal line 500, broken at vacant positions 511 and 512 in FIG. 6, can be connected across the dummy FFs 701 and 702.

Figure 8:
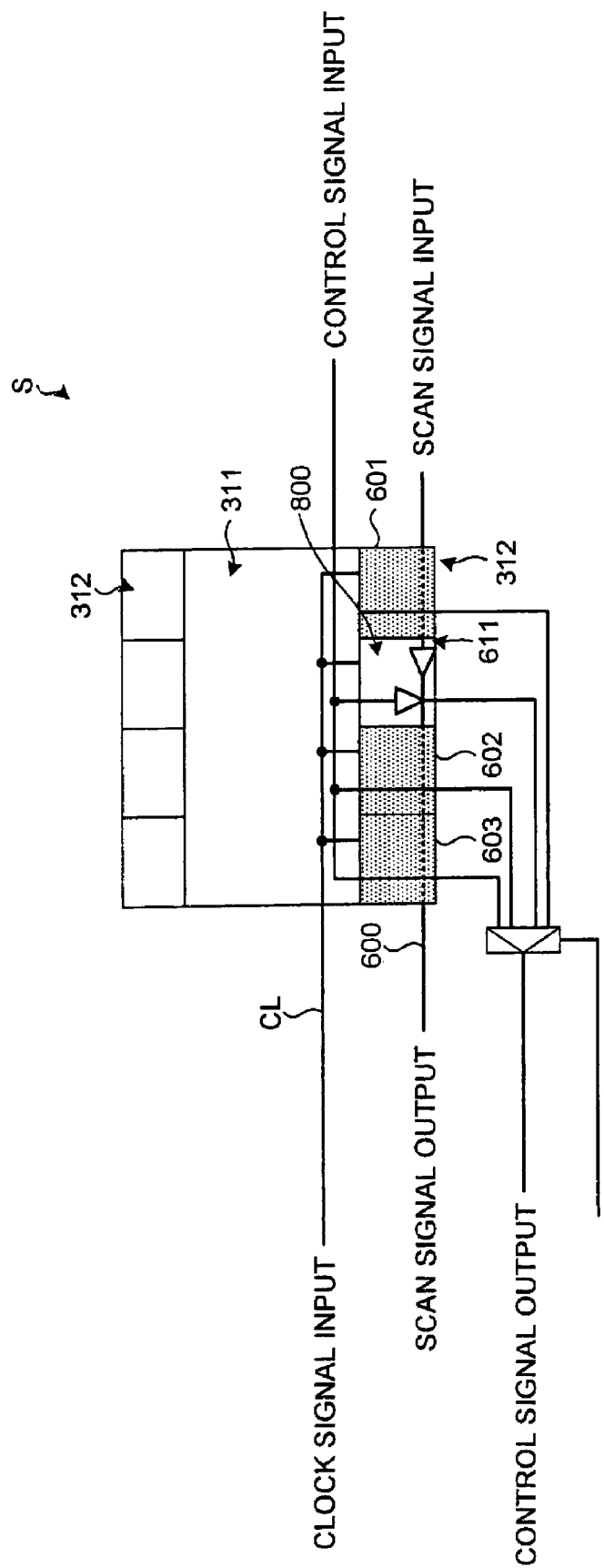
FIG. 8 is a schematic for illustrating bypass elements placed at vacant positions in the RAM placement area shown in FIG. 6.

FIG. 8 is a schematic for illustrating bypass elements placed at vacant positions in the RAM placement area 312 shown in FIG. 6. A dummy RAM 800 that serves as a bypass element is placed at the vacant position 611. The dummy RAM 800 is the bypass element that bypasses the vacant position 611 and propagate therethrough a scan signal from RAM 601 to RAM 602 placed adjacent the vacant position 611. The dummy RAM 800 does not perform such signal processing as is done by other RAMs 601 to 603. With this processing, the scan signal line 600, broken at the vacant position 611 in FIG. 6, can be connected across the dummy RAM 800.

Figure 9:
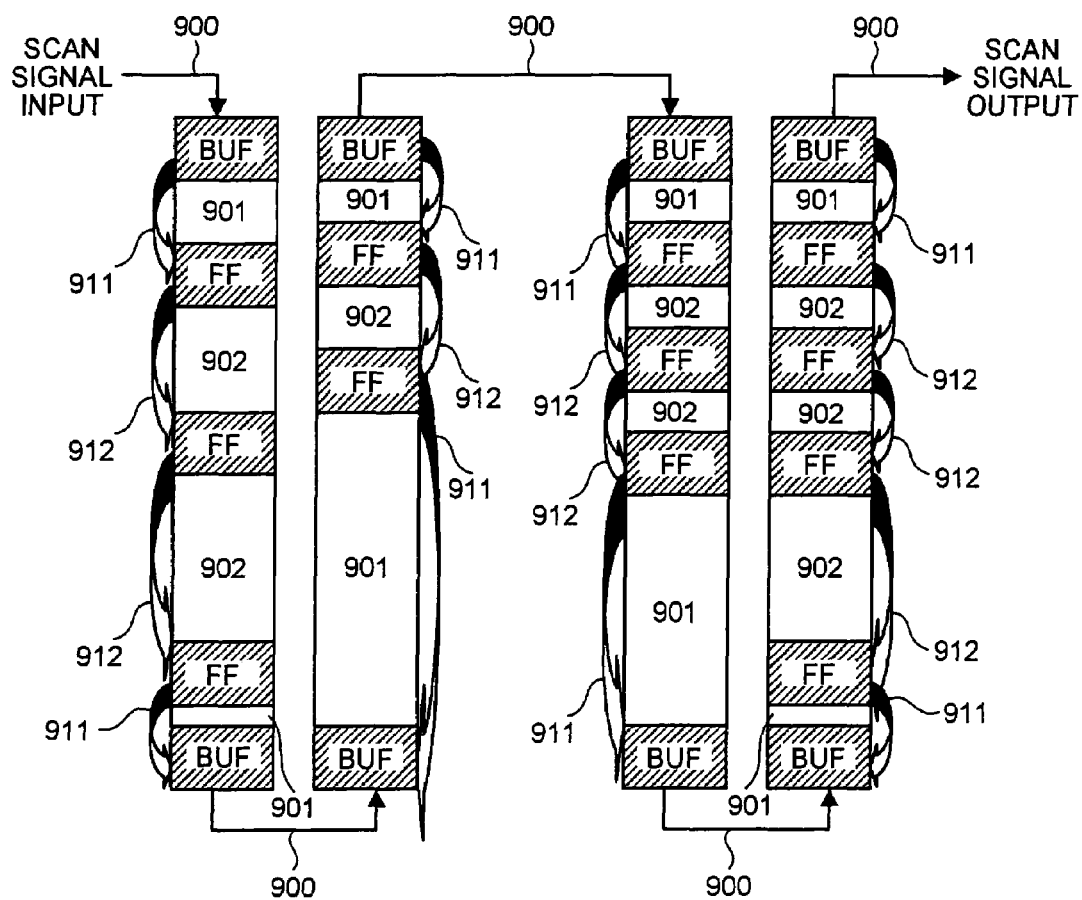
FIG. 9 is a schematic for illustrating scan signal lines formed across the positions where FFs are not placed.

FIG. 9 is a schematic for illustrating scan signal lines formed across the positions where FFs are not placed. Based on pieces of FF placement information (site definitions) described in the netlist, areas (island areas) formed between an arbitrary buffer to another in the FF placement area 311. A reference sign 900 denotes a scan signal line embedded in the frame 300, and corresponds to the scan signal lines SC01 to SC08 in FIG. 3.

An FF to be placed in each island area is then determined based on the FF placement information (a site definition). By sorting the pieces of FF placement information (site definitions) in the direction of propagation of the scan signal, scan signal lines 911 are formed across vacant positions 901 between the buffers and the FFs to interconnect them. Similarly, scan signal lines 912 are formed across vacant positions 902 between FFs to interconnect them. With this configuration, the scan signal lines 911 and 912 can be formed in order of the placement of FFs.

The functional units 203 to 207 explained above are implemented, for example, through execution of programs recorded on the ROM 102, the RAM 103, the HD 105, and the FD 107 by the CPU 101, or by the I/F 109.

Figure 10:
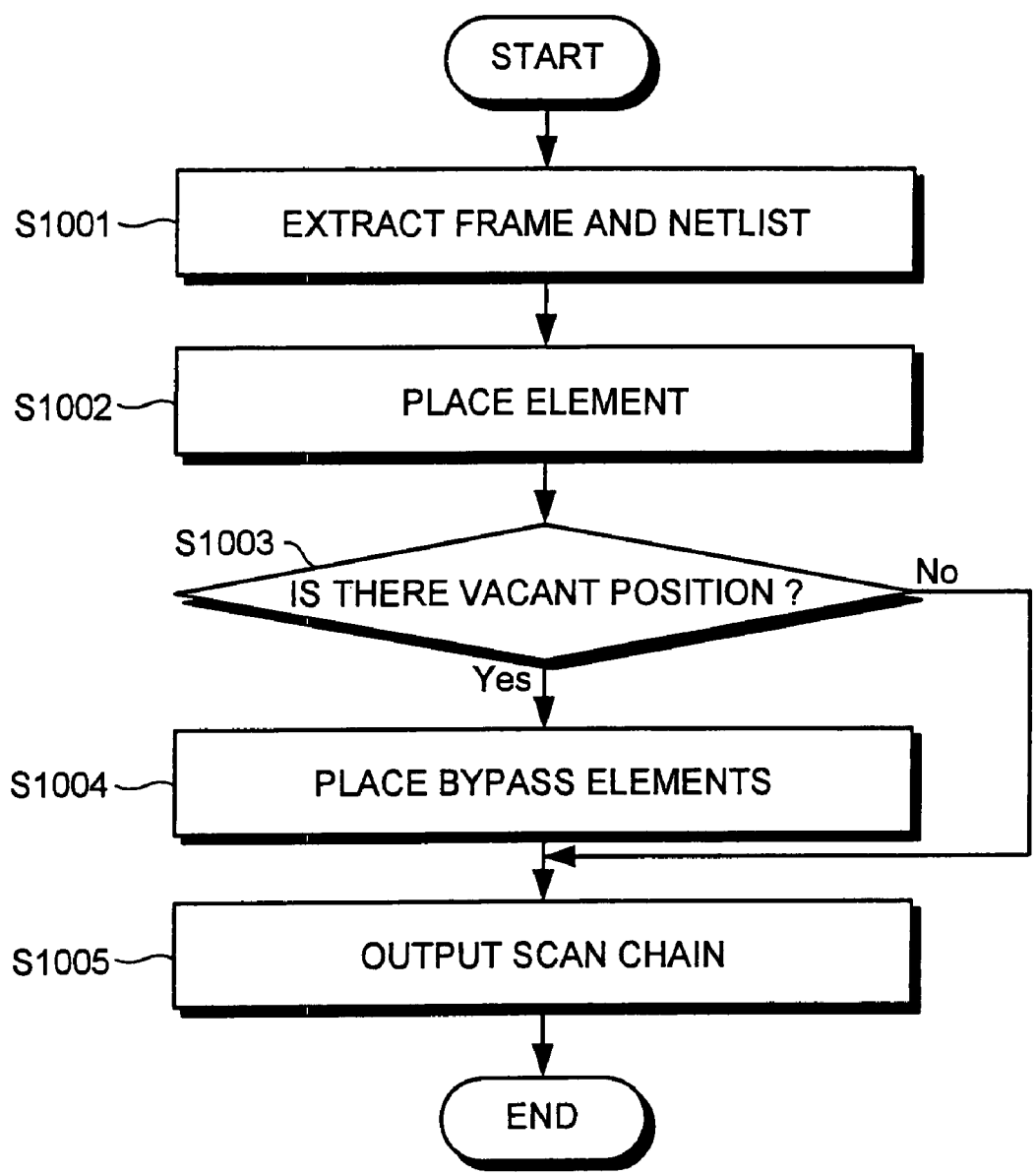
FIG. 10 is a flowchart of a process procedure for a layout design according to the first embodiment.

FIG. 10 is a flowchart of a process procedure for a layout design according to the first embodiment.

The procedure begins with extracting a frame and a netlist from the frame library 201 and the netlist database 202, respectively (step S1001). The next step is to place elements in a frame placement area based on placement information in the netlist (step S1002). This is followed by detecting whether there is a vacant position in the area where the elements have been placed (step S1003). If a vacant position is detected (step S1003: Yes), a bypass element is placed at the detected vacant position (step S1004). After the placement of the bypass element, or when no vacant position has been detected (step S1003: No), a scan chain is output (step S1005). As a result, the scan chain is generated.

According to the first embodiment, it is possible to simplify timing convergence of a test circuit in the layout design. With placement of dummy FFs, the scan chain can be generated under a condition where no timing error exists, and this permits suppression of the scan signal amount.

Also with regard to the RAM, adjustment to clock timing can be omitted. Since no clock signal is applied to the dummy RAM 800, LSI power consumption can be suppressed. By bypassing another signal line, for example, a control line by the dummy RAM 800, it is possible to save space and to downsize the LSI.

A layout design apparatus according to a second embodiment of the present invention will be explained next. Since the apparatus of the second embodiment is identical in hardware configuration with the apparatus of the first embodiment shown in FIG. 1, no explanation will be repeated in this respect.

Figure 11:
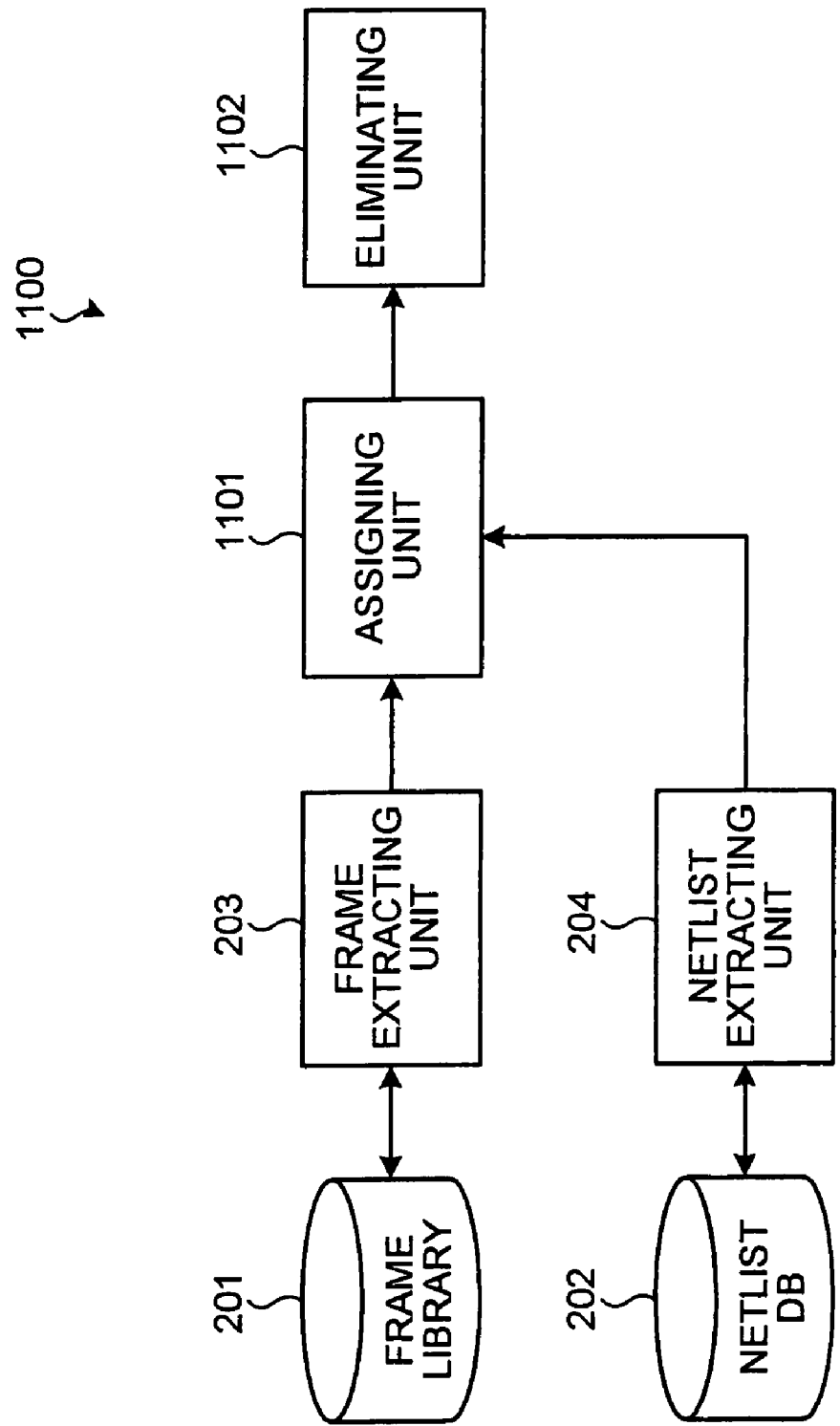
FIG. 11 is a schematic for illustrating a functional configuration of a layout design apparatus according to a second embodiment of the present invention.

FIG. 11 is a schematic for illustrating a functional configuration of a layout design apparatus according to a second embodiment of the present invention. Like parts corresponding to those in FIG. 2 are designated by like reference signs, and no explanation will be repeated. The elements in the second embodiment are the elements pre-placed in the frame shown in FIG. 3; in this embodiment, for example, the elements are PLLs for which check signals are supplied.

A layout design apparatus 1100 includes a frame library 201, a netlist database 202, a frame extracting unit 203, a netlist extracting unit 204, an assigning unit 1101, and an eliminating unit 1102. The assigning unit 1101 assigns PLLs in the netlist extracted by the netlist extracting unit 204 to the PLLs 302 placed in the frame 300 extracted by the frame extracting unit 203. The eliminating unit 1102 eliminates those of the PLLs 302 placed in the frame 300 which are not assigned by the assigning unit 1101.

Figure 12:
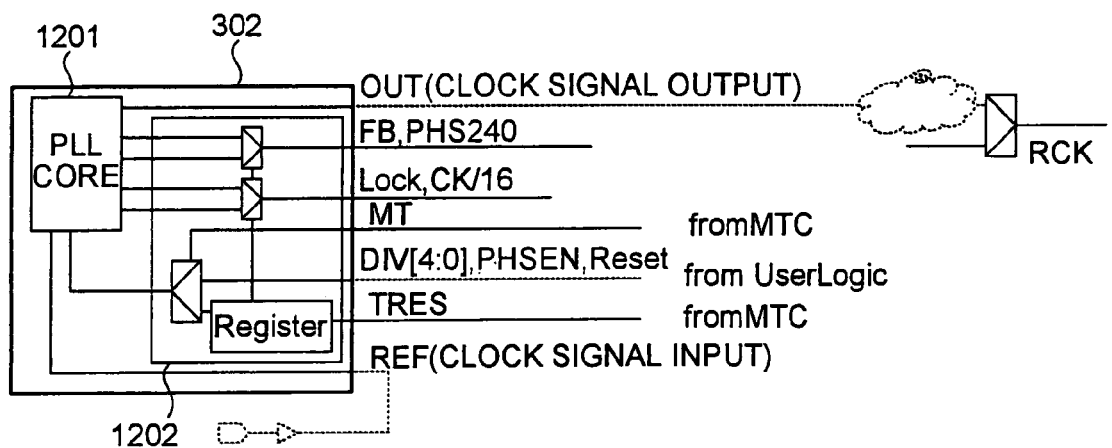
FIG. 12 is a schematic for illustrating a PLL pre-embedded in the frame.

The operation of the eliminating unit 1102 will be explained next. FIG. 12 is a schematic for illustrating a PLL 302 pre-embedded in the frame 300. The PLL 302 is provided with a PLL core 1201 and a test circuit 1202. The PLL core 1201 and the test circuit 1202 input thereinto and output therefrom various signals. Assuming that the PLL 302 is one that has not been assigned by the assigning unit 1101, the eliminating unit 1102 eliminates the PLL core 1201 and the test circuit 1202 in the PLL 302.

Figure 13:
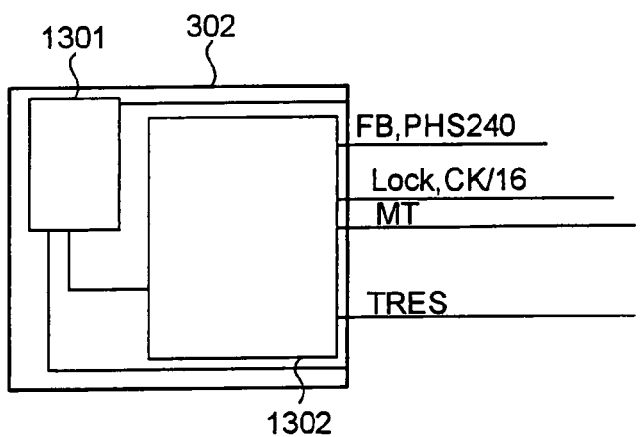
FIG. 13 is a schematic for illustrating a PLL removed by an eliminating unit.

FIG. 13 is a schematic for illustrating a PLL removed by an eliminating unit 1102. In the PLL 302, the PLL core 1201 has been replaced with a dummy core 1301 and the test circuit 1202 shown in FIG. 12 has also been replaced with a dummy test circuit 1302. This avoids power consumption by the PLL 302 not in use, permitting reduction of power requirements of the designed LSI.

Also in FIG. 13, the PLL core 1201 and the test circuit 1202 have been explained as being eliminated by replacement with the dummy core 1301 and the dummy test circuit 1302, but the PLL 302 may be eliminated in its entirety. The functional units 1101 and 1102 explained above are implemented by execution of programs recorded on ROM 102, RAM 103, HD 105, and FD 107 by CPU 101, or I/F 109.

Figure 14:
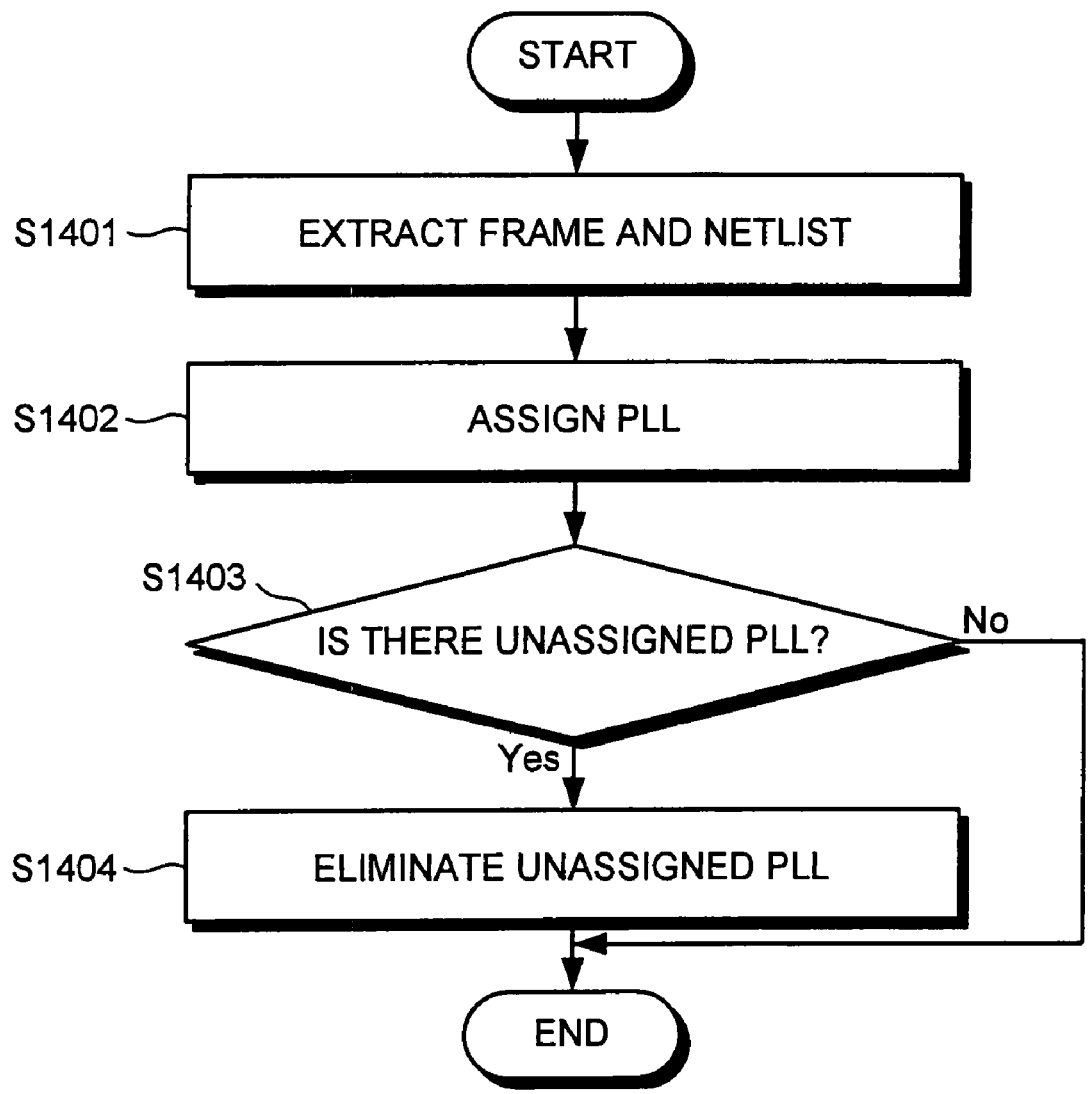
FIG. 14 is a flowchart of a process procedure for a layout design according to the second embodiment.

FIG. 14 is a flowchart of a process procedure for a layout design according to the second embodiment. The procedure begins with extracting a frame and a netlist from the frame library 201 and the netlist database 202, respectively (step S1401). Following this, the PLL in the netlist extracted by the netlist extracting unit 204 is assigned to the PLL 302 placed in the frame 300 extracted b the frame extracting unit 203 (step S1402).

The next step is to detect whether there is an unassigned PLL 302 (step S1403). If no unassigned PLL 302 is detected (step S1403, No), the layout design procedure ends. If an unassigned PLL 302 is detected (step S1403, Yes), it is eliminated by the eliminating unit 1102 (S1404).

According to the second embodiment, it is possible to prevent power the unused PLL 302 from power consumption and hence reduce power requirements of the designed LSI.

Figure 15:
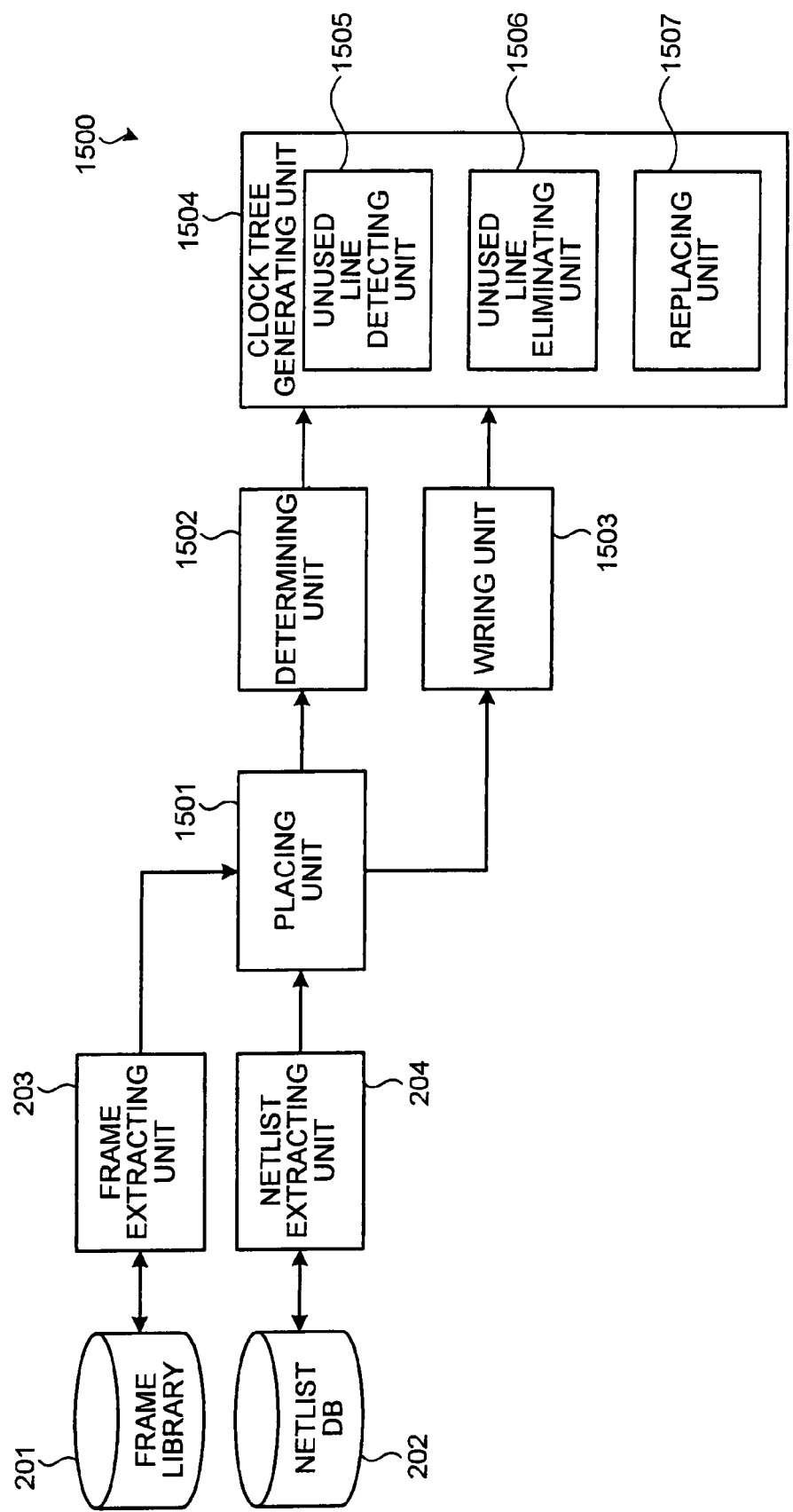
FIG. 15 is a schematic for illustrating a functional configuration of a layout design apparatus according to a third embodiment of the present invention.

FIG. 15 is a schematic for illustrating a functional configuration of a layout design apparatus according to a third embodiment of the present invention. Like parts corresponding to those in FIG. 2 are designated by like reference signs, and no explanation will be repeated.

In a layout design apparatus 1500, based on the netlist extracted by the netlist extracting unit 204, a placing unit 1501 places elements like FFs and RAMs in placement areas of the frame 300 extracted by the frame extracting unit 203. More specifically, the placing unit 1501 automatically places FFs in the FF placement area 311 and RAMs in the RAM placement area 312 based on the connection relationships of clock terminals, FFs and RAMs described in the extracted netlist.

Further, based on the netlist extracted by the netlist extracting unit 204, the placing unit 1501 places a clock terminal as an input element on the frame 300 extracted by the frame extracting unit 203. More specifically, the placing unit 1501 automatically places the clock terminal in the I/O placement area 312 based on the connection relationships of the clock terminal, FFs and RAMs described in the extracted netlist.

Figure 16:
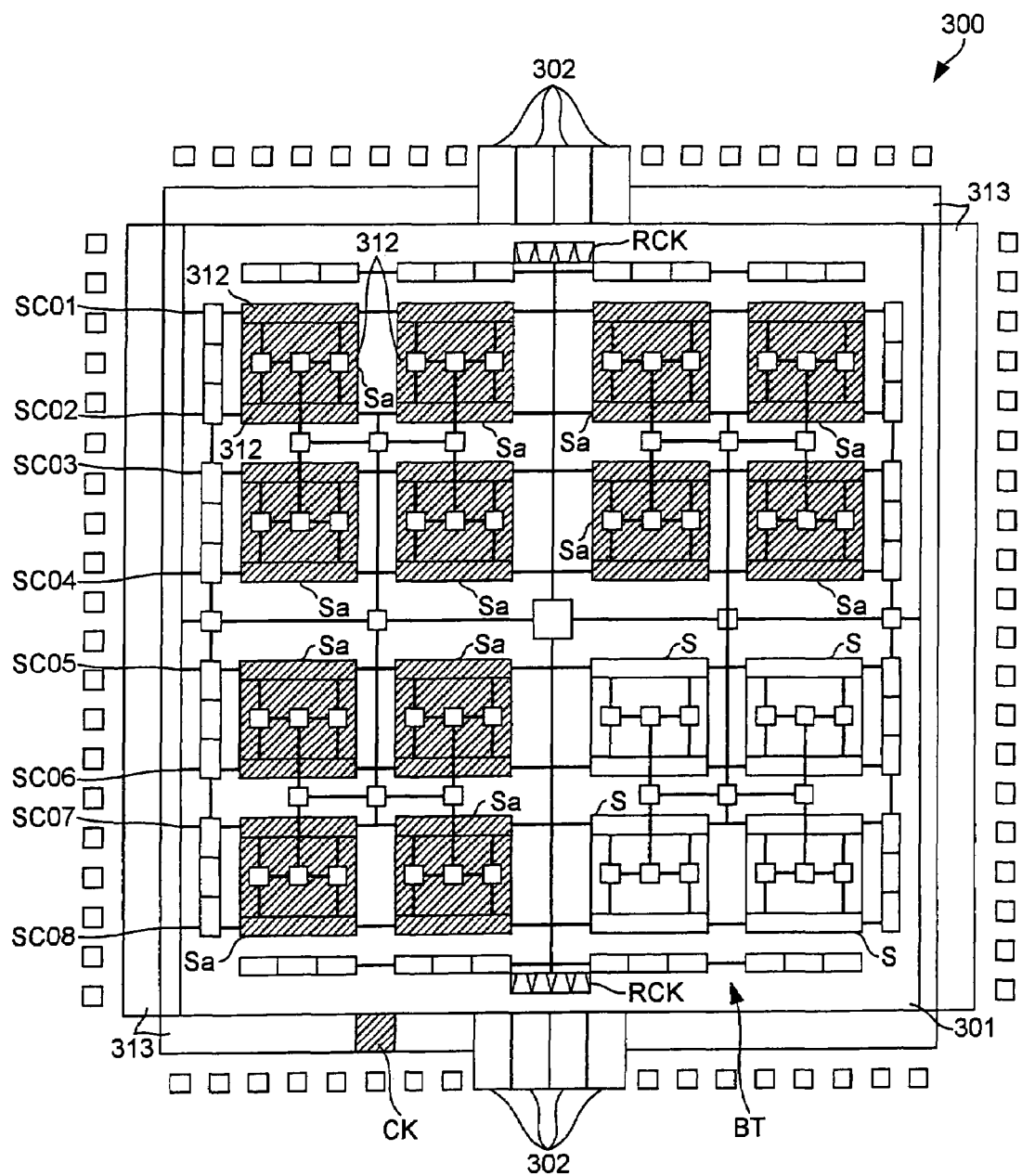
FIG. 16 is a schematic of a frame in which input elements and elements to be supplied are placed by a placing unit.

FIG. 16 is a schematic of a frame in which input elements and elements to be supplied are placed by a placing unit 1501. In the I/O area 313, there is placed a clock terminal CK. Also in FIG. 16, the hatched basic blocks S (Sa) are those which have FFs and RAMs, placed in the FF placement area 311 and RAM placement area 312, respectively.

Figure 17:
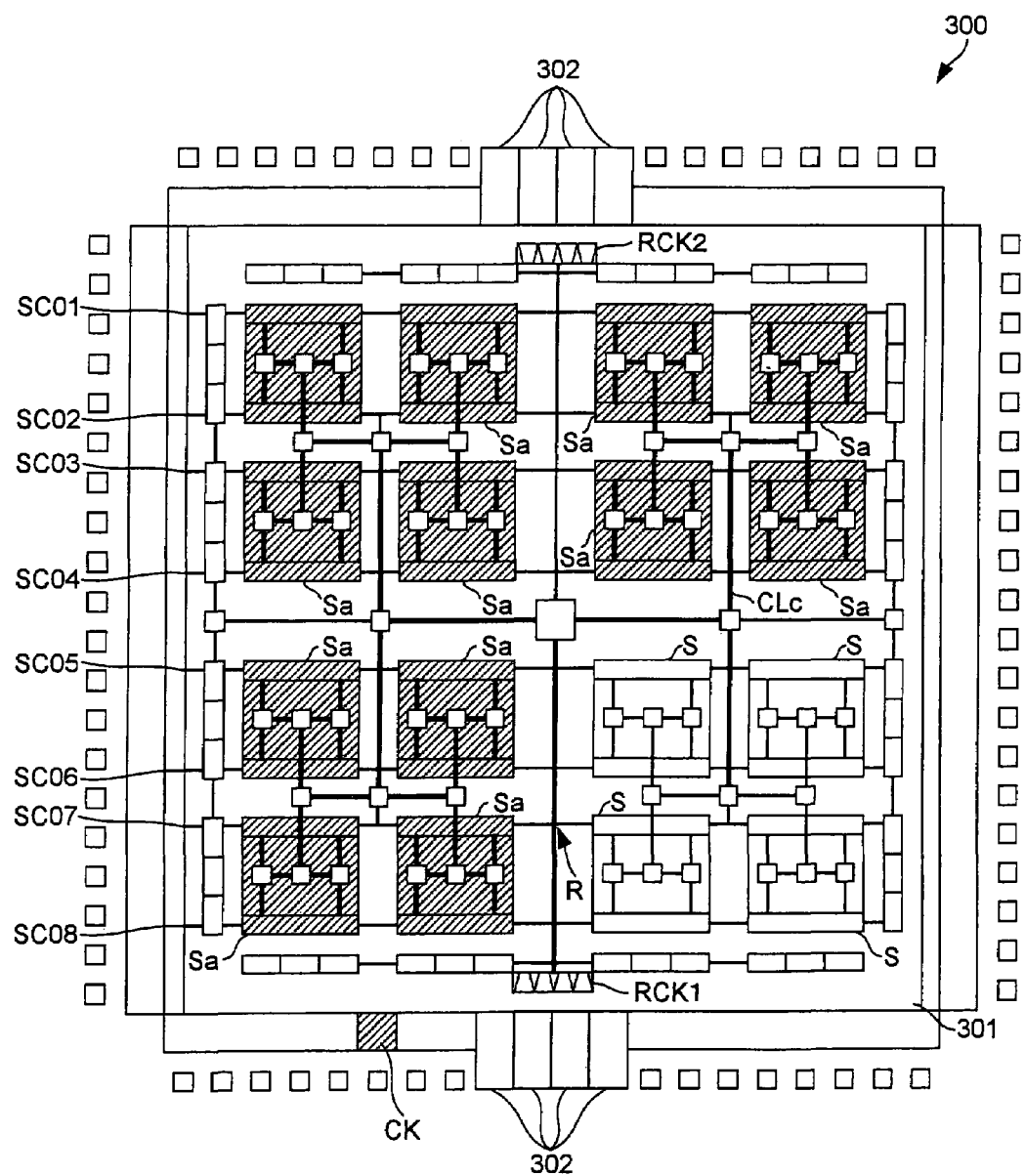
FIG. 17 is a schematic for illustrating an example of wiring routes determined from a placement of elements shown in FIG. 16.

A determining unit 1502 determines a wiring route from a root clock buffer RCK to each basic block S where an element is placed in the buffer tree BT in which elements are placed by the placing unit 1501. FIG. 17 is a schematic for illustrating an example of wiring routes determined from a placement of elements shown in FIG. 16. The wiring routes determined by the determining unit 1502 are thick-lined wiring routes A from the root clock buffer RCK (RCK1) to FFs and RAMs located in the hatched basic blocks Sa in FIG. 17.

The frame 300 has two root clock buffers RCK1 and RCK2 embedded therein. As to which one of the two root clock buffers is used is determined by the position of the clock terminal CK placed in the I/O area 313. That is, the one of the root clock buffers RCK1 and RCK2 which is nearer to the clock terminal CK is selected.

Figure 18:
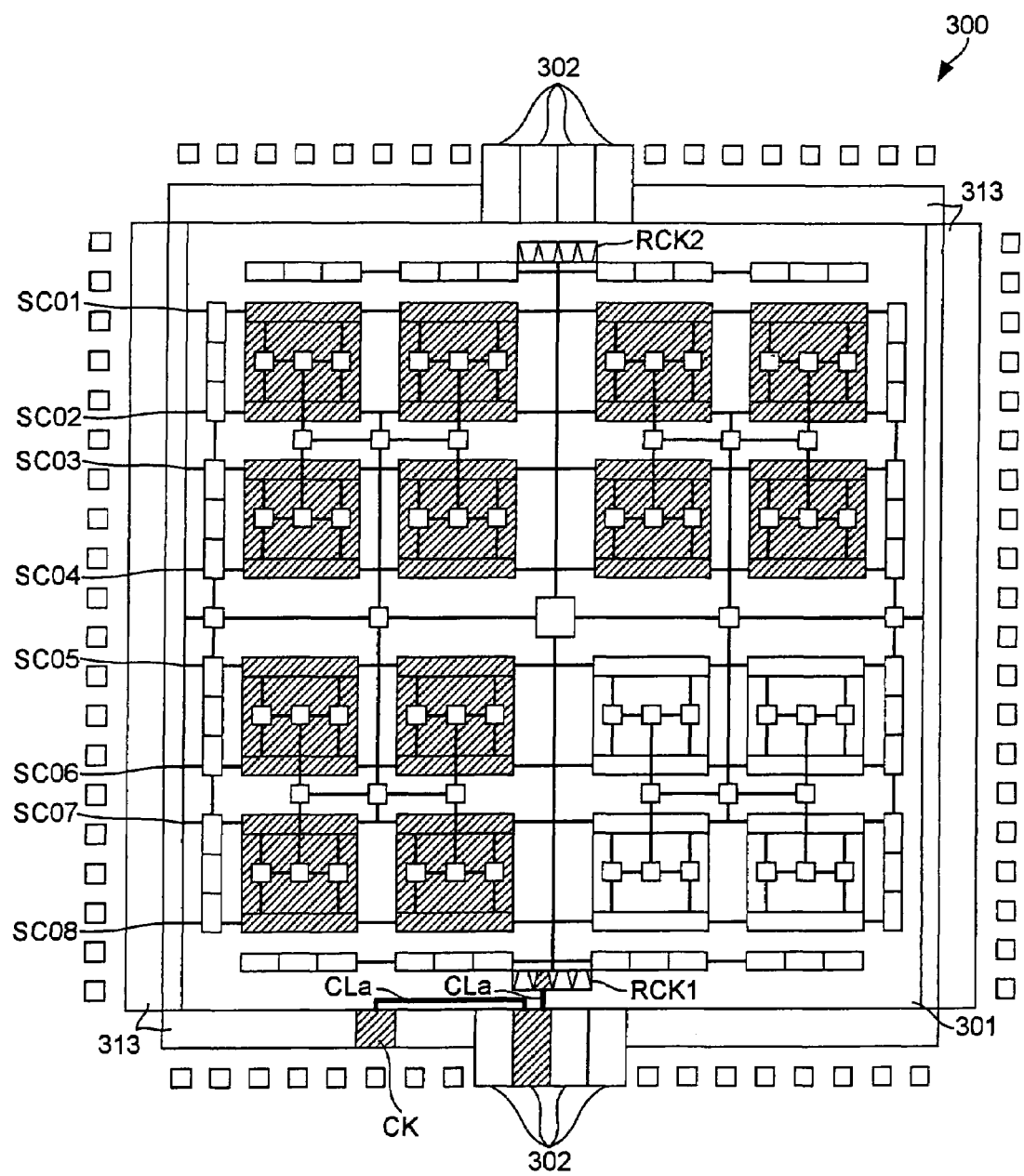
FIG. 18 is a schematic for illustrating an example of a wiring by a wiring unit.

A wiring unit 1503 interconnects the cock terminal CK placed by the placing unit 1501 and the root clock buffer RCK1. FIG. 18 is a schematic for illustrating an example of a wiring by a wiring unit 1503. The wiring unit 1503 forms a clock line CLa between the clock terminal CK placed in the I/O area 313 and the root clock buffer RCK1 on the frame 300 to establish connection between them. When a PLL is connected between the clock terminal CK and the root clock buffer RCK1 in the netlist, a PLL 302 is connected between the clock terminal CK and the root clock buffer RCK1.

Figure 19:
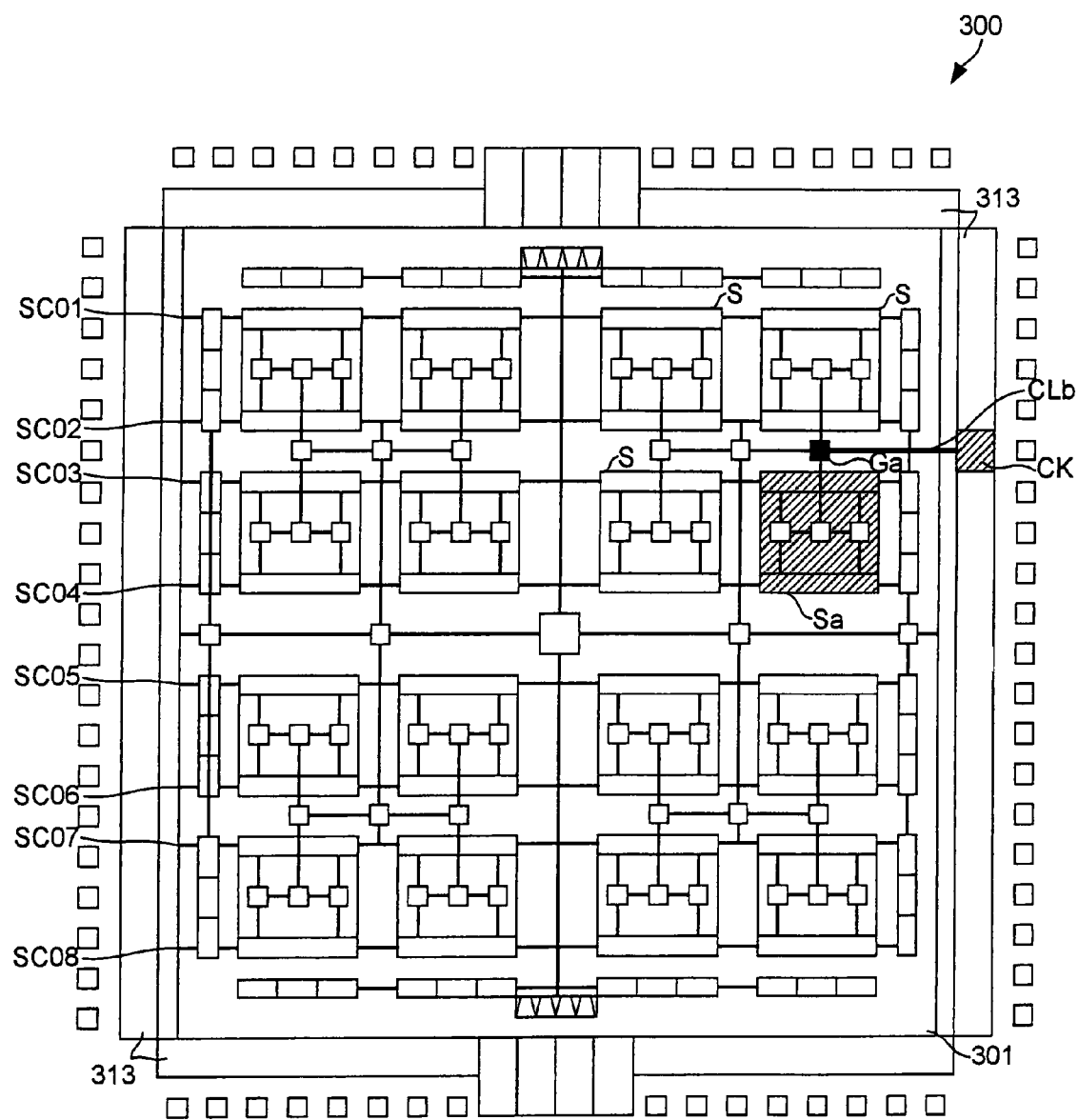
FIG. 19 is a schematic for illustrating another example of the wiring by the wiring unit.

The wiring unit 1503 also establishes connection between the input element placed by the placing unit 1501 and that one (distributing buffer) of the branching buffers which distributes a clock signal to any one of the elements located by the placing unit 1501. FIG. 19 is a schematic for illustrating another example of the wiring by the wiring unit 1503. When no clock root buffer is contained in the netlist as shown in FIG. 19, the wiring unit 1503 establishes connection between a distributing buffer (the black-colored branching buffer) Ga, which forms part of the root of the basic block Sa with FFs and RAMs placed therein, and the clock terminal CK placed in the I/O area 313 to form a clock line CLb. This permits reduction of the wiring route and hence enables suppression of a propagation delay of the clock signal.

Figure 20:
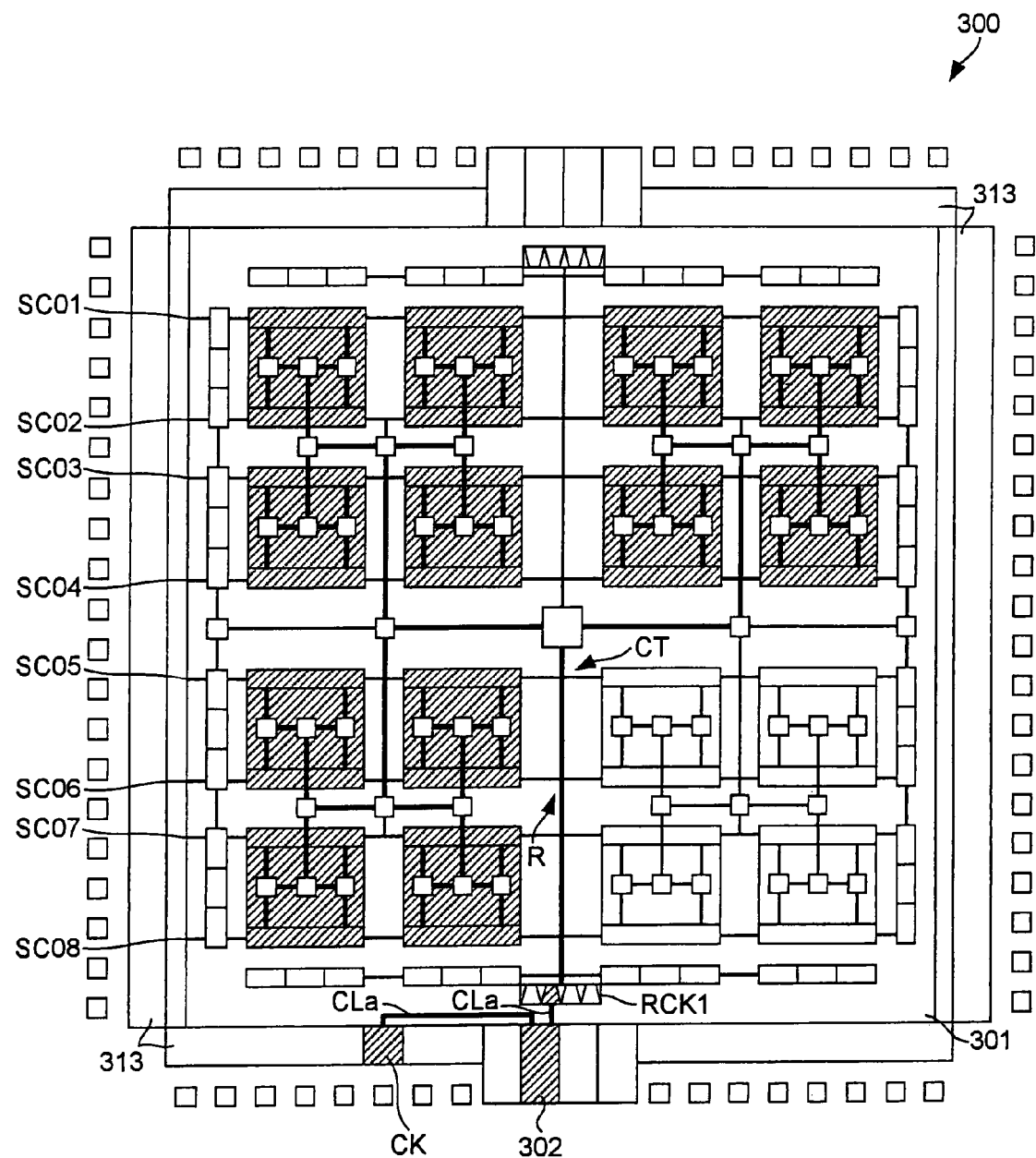
FIG. 20 is a schematic for illustrating an example of a clock tree generated by a generating unit.

A generating unit 1504 generates a clock tree that starts at the input element and terminates at an element located at an extremity of the buffer tree BT, based on the input element and the root buffer interconnected by the wiring unit 1503 and the buffer tree BT having the wiring route determined by the determining unit 1502. FIG. 20 is a schematic for illustrating an example of a clock tree generated by a generating unit 1504. The clock tree CT shown in FIG. 20 is composed of the thick-lined route R indicated in FIG. 17 and the thick-lined clock lines CLa extending from the click terminal CK to the root clock buffer RCK1 via the PLL 302 in FIG. 18.

The generating unit 1504 includes an unused-line detecting unit 1505, an eliminating unit 1506, and a replacing unit 1507. The unused-line detecting unit 1505 detects unused lines in the buffer tree BT which are excluded from the route R determined by the determining unit 1502. This will be explained below with reference to FIG. 17. The clock lines CL indicated by the medium-thick lines are unused lines excluded from the thick-lined route R. The unused-line detecting unit 1505 detects such unused lines CLc. The eliminating unit 1506 eliminates the detected unused lines CLc indicated by the medium-thick lines in FIG. 17.

Figure 21:
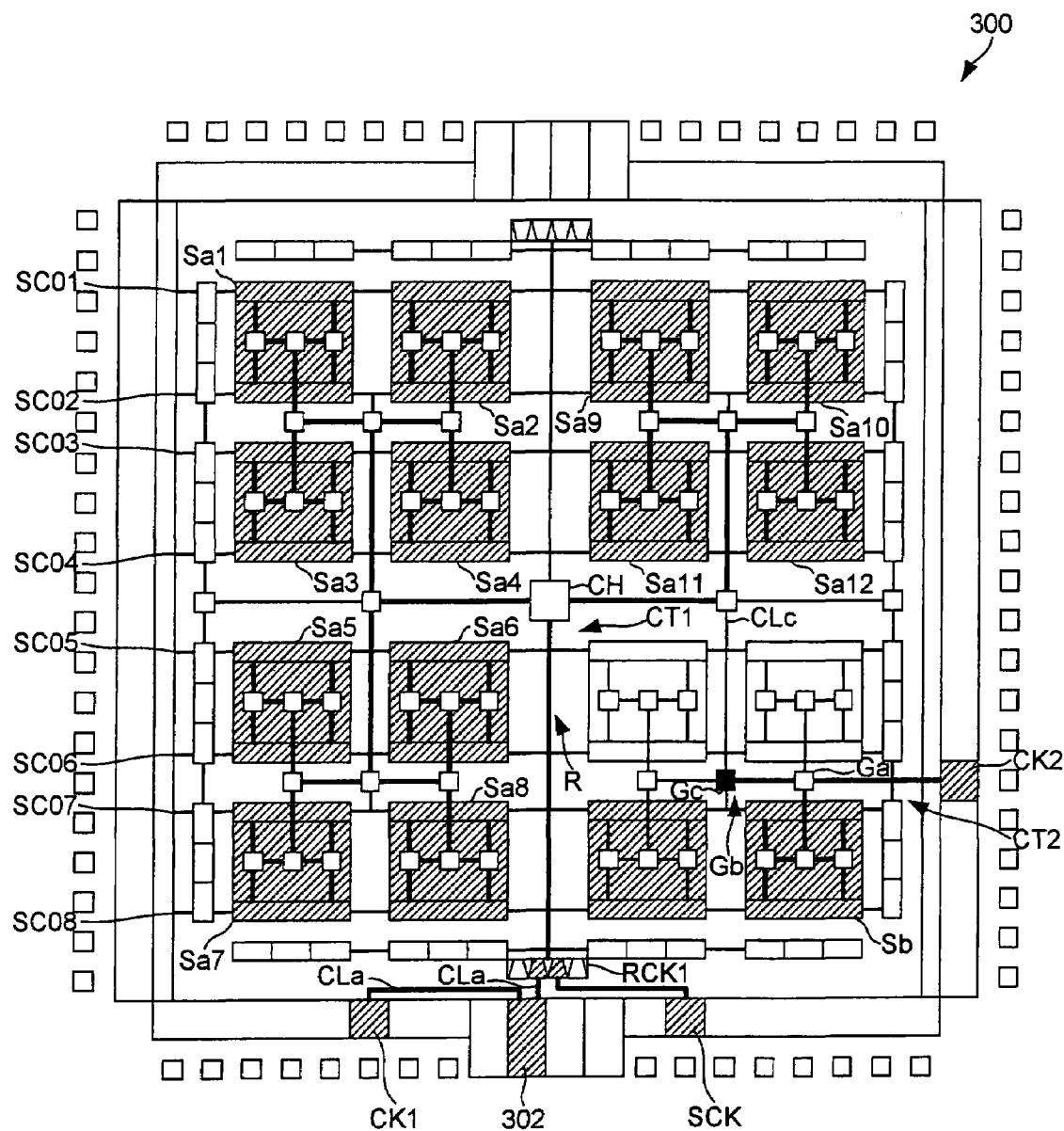
FIG. 21 is a schematic of a frame in which a plurality of clock trees is generated.

A replacing unit 1507 replaces a branching buffer on the unused line CLc detected by the unused-line detecting unit 1505 with an enable buffer capable of switching the propagation of a clock signal. FIG. 21 is a schematic of a frame in which a plurality of clock trees is generated. Incidentally, it is assumed that the buffer replacement step is performed after determination of the route and no clock trees have been generated yet.

The replacing unit 1507 replaces a gate buffer Gc for a branching buffer Gb indicated by the black-colored box in FIG. 21. The gate buffer Gc is an enable buffer that responds to an enable signal to permit or inhibit the passage therethrough of a clock signal. A clock tree CT1 forms a clock signal propagation path of [CK1→PLL302→RCK1→CH→G→basic blocks Sa1 to Sa12], over which a clock signal is propagated from the clock terminal CK1. A clock tree CT2 forms a clock signal propagation path of [CK2→Ga→basic block Sb], over which a clock signal is propagated from the clock terminal CK2.

The root clock buffer RCK1 is a selector, which selects either one of test and system modes, that is, selects either the scan clock terminal SCK or the clock terminal CK1. This selection is performed by a telocator alphanumeric protocol (TAP) controller (not shown). In the test mode, the scan clock terminal SCK is selected, from which a scan cock signal is propagated to the clock trees CT1 and CT2.

In the system mode, the gate buffer Gc inhibits the passage therethrough of the clock signal from the clock terminal CK1 to the clock tree CT2. In the test mode, the gate buffer Gc permits the passage therethrough of the scan clock signal from the scan clock terminal SCK to the clock tree CT2. This suppresses power dissipation since no clock signal is applied to the unused line CLc in the system mode. In the test mode, the scan clock signal can also be propagated to the clock tree CT2 since the gate buffer Gc permits propagation of the scan clock signal.

As shown in FIG. 21, this embodiment enables the clock trees CT1 and CT2 in two netlists to be generated on one frame 300 as shown in FIG. 21. With this configuration, the clock tree CT1 and CT2 of a small clock skew can be generated in a short time. It is also possible to design a high-density, high-performance LSI in a short time.

Figure 22:
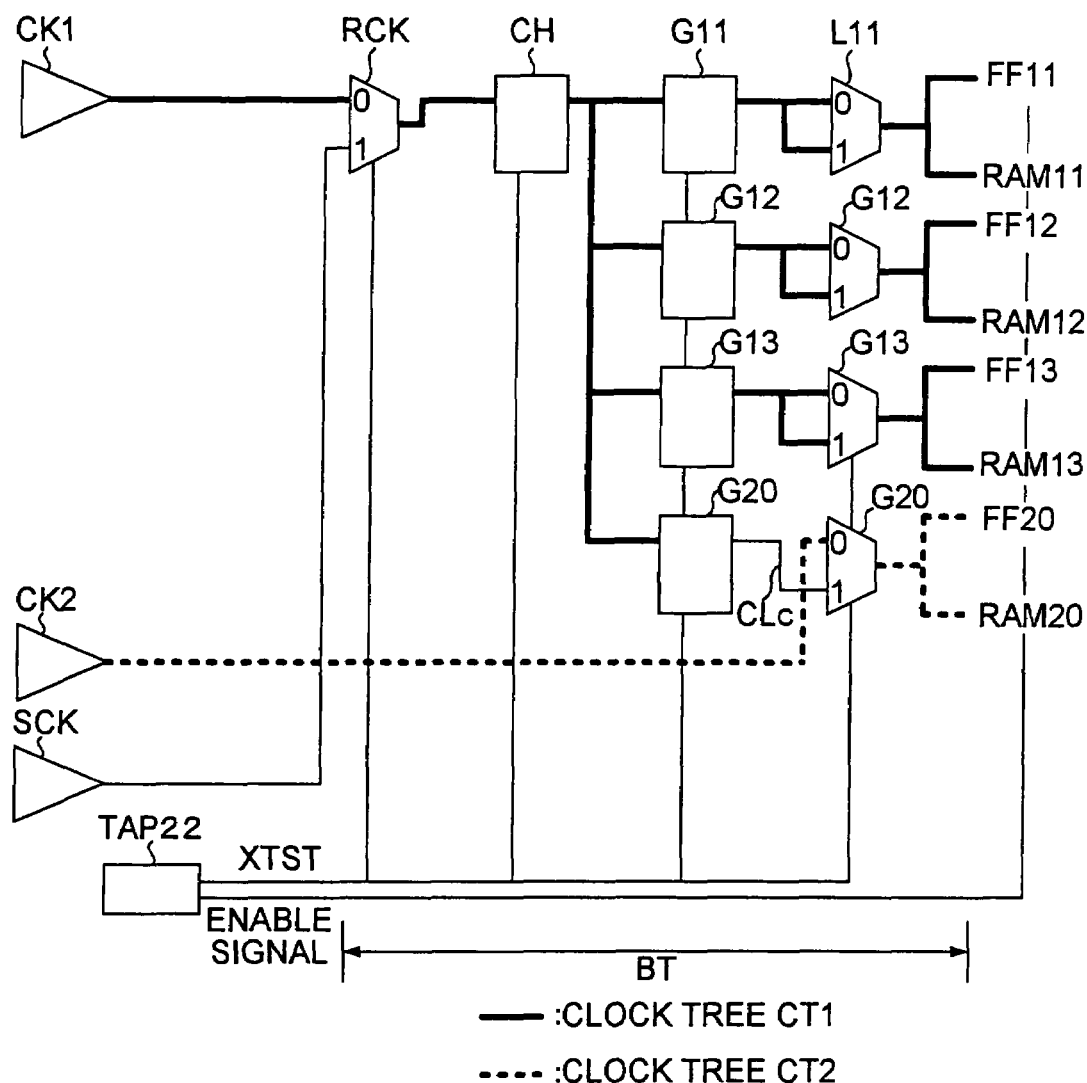
FIG. 22 is a logic circuit diagram of the clock trees shown in FIG. 21.

FIG. 22 is a logic circuit diagram of the clock trees CT1 and CT2 in FIG. 21. The root clock buffer RCK, the clock hub CH, buffers G (G11 to G13, G20) and buffers L (L11 to L13, L20) are pre-embedded in the frame to form a skew-adjusted buffer tree BT. The TAP controller 22 is also pre-embedded in the frame, which input a XawTextScanType (XTST) signal to the root clock buffer RCK, the clock hub CH, the buffers G, and the buffers L to switch the signal propagation route.

FFs (FF11 to FF13, FF20) and RAMs (RAM11 to RAM13, RAM20) are elements embedded in the FF placement area and the RAM placement area, respectively. The scan clock terminal SCK, the clock terminal CK1 and the clock terminal CK2 are terminals embedded in the I/O area of the frame. The FFs (FF11 to FF13, FF20) and RAMs (RAM11 to RAM13, RAM20) each accept the input of the enable signal from the TAP controller 22.

The clock tree CT1 forms a route of [clock terminal CK1→root clock buffer RCK→clock hub CH→buffers G (G11 to G13), buffers L (L11 to L13), FFs (FF11 to FF13), RAMs (RAM11 to RAM13)]. The clock tree CT1 forms a route of [clock terminal CK2→buffer L (L20)→FF (FF20) →RAM (RAM20)].

The root clock buffer RCK inputs the scan clock signal from the scan clock terminal SCK and the clock signal from the clock terminal CK1. The root clock buffer RCK1 is a selector, which selects the test mode or system mode, that is, selects either one of the scan clock terminal SCK or clock terminal CK1. This selection is made by the TAP controller 22. The clock line CLc is the unused line shown in FIG. 21.

In the test mode, the scan clock terminal SCK is selected, from which the scan clock signal is applied to the clock trees CT1 and CT2. The buffer L20 is supplied with the clock signal from the clock terminal CK2 and the clock signal from the buffer G20 (the clock signal from the clock terminal CK1).

When the system mode is selected by the TAP controller 22, the root clock buffer RCK selects "0", and permits th passage therethrough of the clock signal from the clock terminal CK1. Similarly, the buffer L20 also selects "0", and permits the passage therethrough of the clock signal from the clock terminal CK2. When the test mode is selected by the TAP controller 22, the root clock buffer RCK and the buffer L20 select "1", and permit the passage therethrough of the scan clock signal from th scan clock terminal SCK to the clock trees CT1 and CT2.

Since in the system mode the clock signal is not applied to the unused line CLc from the clock terminal CK1, power consumption can be suppressed. In the test mode, the scan clock signal can be provided to the clock tree CT2 as well since the buffer L20 permits the passage therethrough of the scan clock signal.

Figure 23:
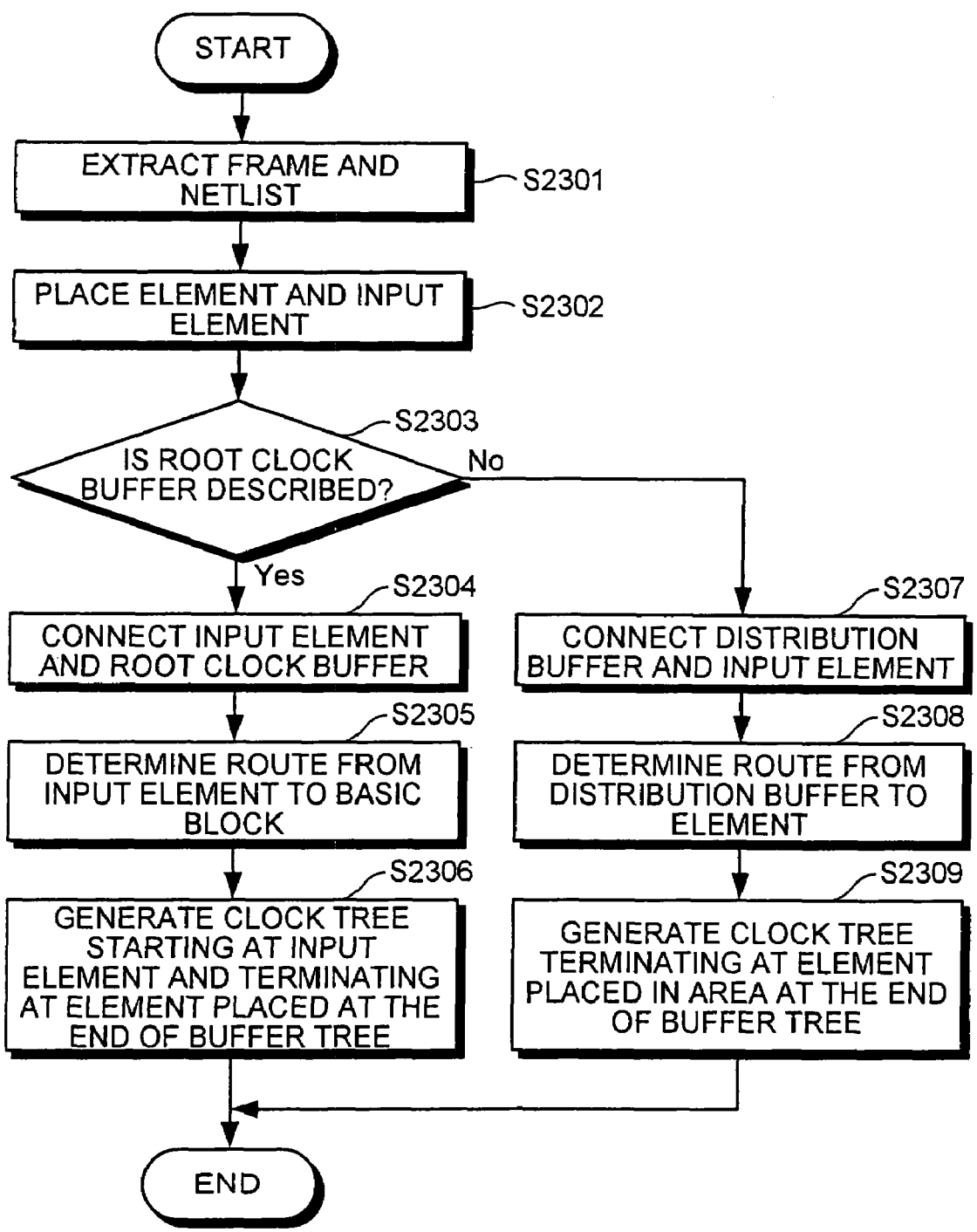
FIG. 23 is a flowchart of a process procedure for a layout design according to the third embodiment.

FIG. 23 is a flowchart of a process procedure for a layout design according to the third embodiment. The procedure begins with extracting a frame and a netlist from the frame library 201 and the netlist database 202, respectively (step S2301). Following this, an element and an input element are placed in the I/O placement area of the frame 300 based on placement information in the netlist (step S2302). When the root clock buffer RCK is described in the netlist (step S2303, Yes), the input element (the clock terminal CK) and the root clock buffer RCK are interconnected (step S2304).

The next step is to determine the wiring route from the input element to the basic block S where elements (FF, RAM) are located (step S2305). This is followed by generating a clock tree CT that starts at the input element and terminates at an element located at an extremity of the buffer tree BT, based on the input element and the root buffer RCK interconnected by the wiring unit 1503 and the buffer tree BT having the route R determined by the determining unit 1502 (step S2306).

When the root clock buffer RCK is not described in the netlist (step S2303, No), the branching buffer (distributing buffer), which forms part of the root of the basic block S with elements placed therein, and the input element are interconnected (step S2307). In the buffer tree BT in which the element has been placed by the placing unit 1501, the route from the distributing buffer to the element is determined (step S2308).

Following this, based on the input element and the distributing buffer interconnected by the wiring unit 1503 and the buffer tree BT having the route determined by the determining unit 1502, a clock tree CT is generated which starts at the input element and terminates at an element located at an extremity of the buffer tree BT (sep S2309).

According to the third embodiment, since a clock tree can be formed in the frame having embedded therein the buffer tree previously skew-adjusted, a clock tree of a small clock skew can be implemented in a short time.

With the layout design apparatus explained above, the layout design method, the layout design program and the recording medium according to the first to the third embodiments explained above, it is possible to reduce the layout design time while suppressing unnecessary power consumption. Further, the buffer tree BT previously skew-adjusted can be customized with the clock skew suppressed.

The layout design method according to the present invention can be implemented by executing a prepared program by a computer such as a personal computer and a workstation. The program is recorded on a computer readable recording medium such as a hard disk, a flexible disk, a CD-ROM, an MO, or a DVD, and read from the recording medium and realized by the computer. The program may also be a transmission medium that can be distributed via a network such as the Internet.

According to the layout design apparatus, the layout design method, the layout design program, and the recording medium according to the present invention, it is possible to suppress unnecessary power consumption by an LSI chip and reduce the time for layout design. It is also possible to suppress the clock skew.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A layout design apparatus that communicates with a frame library and a netlist database, the apparatus comprising:
    a frame input unit that receives, from the frame library, an input of a frame having a plurality of pre-placed elements to which a predetermined signal is supplied;
    a netlist input unit that receives, from the netlist database, an input of a netlist concerning at least one of the plurality of pre-placed elements;
    an assigning unit that assigns an element to which the predetermined signal is supplied in the netlist input by the netlist input unit to at least one of the plurality of pre-placed elements in the frame input by the frame input unit; and
    an eliminating unit that eliminates a pre-placed element in the frame that is not assigned by the assigning unit.

2. The layout design apparatus according to claim 1, wherein
    the predetermined signal is a clock signal, and
    the at least one pre-placed element and the element are phase-locked loop elements.

3. A layout design method for a layout design apparatus that communicates with a frame library and a netlist database, the method comprising:
    receiving, from the frame library, an input of a frame having a plurality of pre-placed elements to which a predetermined signal is supplied;
    receiving, from the netlist database, an input of a netlist concerning at least one of the plurality of pre-placed elements;
    assigning an element to which the predetermined signal is supplied in the netlist input by the netlist input unit to at least one of the plurality of pre-placed elements in the frame input by the frame input unit; and
    eliminating a pre-placed element in the frame that is not assigned by the assigning unit.

4. A computer readable recording medium that stores a computer program for a layout design, the computer program making a computer execute:
    receiving an input of a frame having a plurality of pre-placed elements to which a predetermined signal is supplied;
    receiving an input of a netlist concerning at least one of the plurality of pre-placed elements;
    assigning an element to which the predetermined signal is supplied in the netlist input by the netlist input unit to at least one of the plurality of pre-placed elements in the frame input by the frame input unit; and
    eliminating a pre-placed element in the frame that is not assigned by the assigning unit.

* * * * *